(12) United States Patent
Sato et al.

(10) Patent No.: US 12,489,041 B2
(45) Date of Patent: Dec. 2, 2025

(54) SEMICONDUCTOR MODULE, SEMICONDUCTOR DEVICE, AND SEMICONDUCTOR DEVICE MANUFACTURING METHOD

(71) Applicant: FUJI ELECTRIC CO., LTD., Kawasaki (JP)

(72) Inventors: Tadahiko Sato, Matsumoto (JP); Ryoichi Kato, Matsumoto (JP); Yuma Murata, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 428 days.

(21) Appl. No.: 17/956,787

(22) Filed: Sep. 29, 2022

(65) Prior Publication Data

US 2023/0142607 A1 May 11, 2023

(30) Foreign Application Priority Data

Nov. 5, 2021 (JP) .................................. 2021-180714

(51) Int. Cl.
*H01L 23/498* (2006.01)
*H01G 2/06* (2006.01)
(Continued)

(52) U.S. Cl.
CPC ......... *H01L 23/49811* (2013.01); *H01G 2/06* (2013.01); *H01L 21/4853* (2013.01); *H01R 4/029* (2013.01); *H01R 12/55* (2013.01); *H01R 43/0221* (2013.01); *H01L 24/32* (2013.01); *H01L 24/40* (2013.01); *H01L 24/48* (2013.01); *H01L 24/73* (2013.01); *H01L 25/072* (2013.01); *H01L 25/18* (2013.01); *H01L 2224/32225* (2013.01); *H01L 2224/40225* (2013.01); *H01L 2224/48225* (2013.01); *H01L 2224/73221* (2013.01); *H01L 2224/73263* (2013.01);
(Continued)

(58) Field of Classification Search
CPC .... H01R 4/029; H01R 43/0221; H01R 12/55; H01G 2/06
See application file for complete search history.

(56) References Cited

U.S. PATENT DOCUMENTS 10,374,521 B2  8/2019  Böhmer et al.
10,405,450 B2  9/2019  Mcpherson et al.
(Continued)

FOREIGN PATENT DOCUMENTS

JP    2007234694 A    9/2007
JP    2008066561 A    3/2008
(Continued)

*Primary Examiner* — Timothy J Thompson
*Assistant Examiner* — Rhadames Alonzo Miller
(74) *Attorney, Agent, or Firm* — Rabin & Berdo, P.C.

(57) ABSTRACT

A semiconductor module includes an insulating sheet which has a first surface and extends in a first direction and a first terminal. The first terminal has a first region disposed on the first surface of the insulating sheet and having a first width in a second direction perpendicular to the first direction, a second region extending from the first region and having a second width in the second direction narrower than the first width, and a third region located away from the first surface and being electrically connected to both the first region and the second region.

15 Claims, 14 Drawing Sheets

(51) Int. Cl.
  *H01L 21/48* (2006.01)
  *H01L 23/00* (2006.01)
  *H01L 25/07* (2006.01)
  *H01L 25/18* (2023.01)
  *H01R 4/02* (2006.01)
  *H01R 12/55* (2011.01)
  *H01R 43/02* (2006.01)

(52) U.S. Cl.
  CPC ............. *H01L 2224/73265* (2013.01); *H01L 2924/13055* (2013.01); *H01L 2924/13091* (2013.01)

(56) References Cited

U.S. PATENT DOCUMENTS

| | | | |
|---|---|---|---|
| 11,264,348 B2* | 3/2022 | Kawashiro | H01L 24/29 |
| 2014/0203420 A1* | 7/2014 | Miyasaka | H01L 25/18 |
| | | | 219/121.64 |
| 2016/0079143 A1* | 3/2016 | Sakamoto | H01L 23/3675 |
| | | | 438/122 |
| 2019/0295991 A1* | 9/2019 | Takahashi | H01L 21/565 |
| 2020/0023465 A1 | 1/2020 | Okumoto | |
| 2021/0074666 A1* | 3/2021 | Kawashiro | H01L 25/18 |
| 2021/0098347 A1 | 4/2021 | Hayashiguchi et al. | |
| 2021/0202372 A1 | 7/2021 | Kato et al. | |
| 2021/0308791 A1* | 10/2021 | Fuji | H01L 24/04 |
| 2022/0199566 A1 | 6/2022 | Fuji | |

FOREIGN PATENT DOCUMENTS

| | | |
|---|---|---|
| JP | 2016185067 A | 10/2016 |
| JP | 2021106235 A | 7/2021 |
| WO | 2013039099 A1 | 3/2013 |
| WO | 2019077866 A1 | 4/2019 |
| WO | 2019239771 A1 | 12/2019 |
| WO | 2020179369 A1 | 9/2020 |

* cited by examiner

SEMICONDUCTOR MODULE, SEMICONDUCTOR DEVICE, AND SEMICONDUCTOR DEVICE MANUFACTURING METHOD

CROSS-REFERENCE TO RELATED APPLICATION

This application is based upon and claims the benefit of priority of the prior Japanese Patent Application No. 2021-180714, filed on Nov. 5, 2021, the entire contents of which are incorporated herein by reference.

BACKGROUND OF THE INVENTION

1. Field of the Invention

The embodiments discussed herein relate to a semiconductor module, a semiconductor device, and a semiconductor device manufacturing method.

2. Background of the Related Art

For example, a semiconductor module having a power conversion function includes power devices. Examples of these power devices include insulated gate bipolar transistors (IGBTs), free wheeling diodes (FWDs), and metal-oxide-semiconductor field-effect transistors (MOSFETs). There are cases in which a capacitor is connected to a semiconductor module, to stabilize a direct-current (DC) voltage applied.

In addition, there are cases in which a terminal of a semiconductor module is connected to a terminal of a capacitor via a connection member. These terminals are connected by using screws, for example. However, if the connection is performed by using screws, the contact resistance is increased at the portions where the connection member and the terminals are connected, and the connection portions tend to change significantly over the passage of time. To solve this problem, an ultrasonic bonding method has been proposed as a method for connecting a connection member and a terminal (for example, see Japanese Laid-open Patent Publication No. 2007-234694). In this ultrasonic bonding, a connection member and a terminal are disposed to overlap with each other, and ultrasonic vibration is generated on a bonding portion. This vibration electrically and mechanically connects the connection member and the terminal.

In addition, laser welding is known as a method for bonding a connection member and a terminal without causing physical stress thereto (for example, see International Publication Pamphlet No. 2019/077866). This laser welding is for bonding metal members disposed to overlap with each other. Specifically, a laser beam is emitted to the metal members to locally melt these metal members. By solidifying the melted these metal members, the metal members are bonded to each other. In the laser welding, the laser energy is locally concentrated to melt the metal members in the incident direction of the laser beam. Thus, unless the amount of heat generated inside the metal members is appropriately controlled, the melted portion could penetrate through the metal members. To solve this problem, International Publication Pamphlet No. 2019/077866 proposes a technique of disposing a protective member having a higher melting point than that of the metal members on which laser welding is performed. This protective member is disposed on the metal member opposite to the metal member on which the laser beam is incident. The protective member stops further progress of the melted portion after the melted portion has penetrated through the metal members.

Regarding a semiconductor module connected to a capacitor, the following technique for providing a terminal portion is also known. That is, in this technique, a laminated terminal portion is formed as a terminal portion of a semiconductor module. Specifically, a first power terminal, an insulating sheet, and a second power terminal are disposed in this order to overlap with each other. Part of the first power terminal is exposed to the outside beside the insulating sheet, and the second power terminal is located on the insulating sheet, with the part and a terrace portion of the insulating sheet being exposed to the outside (for example, see Japanese Laid-open Patent Publication No. 2021-106235). Laser welding is performed on a first connection terminal of a capacitor and the first power terminal exposed to the outside beside the insulating sheet of the laminated terminal portion. Laser welding is also performed on a second connection terminal of the capacitor and the second power terminal on the insulating sheet.

In another known laser welding technique, when an upper terminal and a lower terminal, which are used as wiring members inside a semiconductor device, are bonded to each other by laser welding, a space is formed between the upper terminal and the lower terminal (for example, see International Publication Pamphlet No. 2013/039099).

There is known a still another laser welding technique for welding a lead frame, which is used as an internal wiring lead member of a semiconductor device, and a heat spreader, which is bonded to the lead frame. In this technique, a spacer having openings is inserted between the lead frame and the heat spreader, and a laser beam is emitted to the locations corresponding to the openings (for example, see Japanese Laid-open Patent Publication No. 2008-66561).

In addition, there is known a technique for firmly attaching an electrical wiring board including a DC positive wiring board and a DC negative wiring board of a power module used for an inverter device of a power conversion apparatus to a positive conductive board and a negative conductive board of a capacitor module of the power conversion apparatus by laser welding or the like (for example, see Japanese Laid-open Patent Publication No. 2016-185067).

There is also known a technique for bonding a lead member (a connection member) that electrically connects a metal plate (an electrode member) disposed on a main surface of a semiconductor element bonded to one conductive board (a conductive member) to another conductive board (a conductive by laser welding (for example, see International member) Publication Pamphlet No. 2020/179369).

There is also known a technique for bonding a first terminal portion and a second terminal portion that are disposed to sandwich an insulating member of a semiconductor device to a first feed terminal and a second feed terminal that are disposed to sandwich an insulating member of a bus bar by laser welding such that the first feed terminal is electrically connected to the first terminal portion and the second feed terminal is electrically connected to the second terminal portion (for example, see International Publication Pamphlet No. 2019/239771).

There is also known a technique for laminating bus bars connected to positive and negative electrodes of a capacitor via an insulating film (for example, U.S. Pat. No. 10,405,450). There is also known a technique for physically separating bus bars and forming the bus bars to overlap with each other (for example, U.S. Pat. No. 10,374,521).

For example, as in the above Japanese Laid-open Patent Publication No. 2021-106235, when a semiconductor module terminal portion connected to a capacitor has a laminated structure in which an insulating sheet is sandwiched between positive and negative terminals, if a connection member is disposed directly on one of the terminals on the insulating sheet and if laser welding is performed by emitting a laser beam to the connection member, the heat generated by the welding could cause damage to the insulating sheet under the one terminal. If the insulating sheet is damaged, the original insulating performance could not be maintained, and the dielectric strength could be deteriorated.

SUMMARY OF THE INVENTION

In one aspect of the embodiments, there is provided a semiconductor module including: an insulating sheet that has a first surface and extends in a first direction; and a first terminal that has a first region disposed on the first surface of the insulating sheet and having a first width in a second direction perpendicular to the first direction, a second region extending from the first region and having a second width in the second direction narrower than the first width, and a third region located away from the first surface and being electrically connected to both the first region and the second region.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1A:
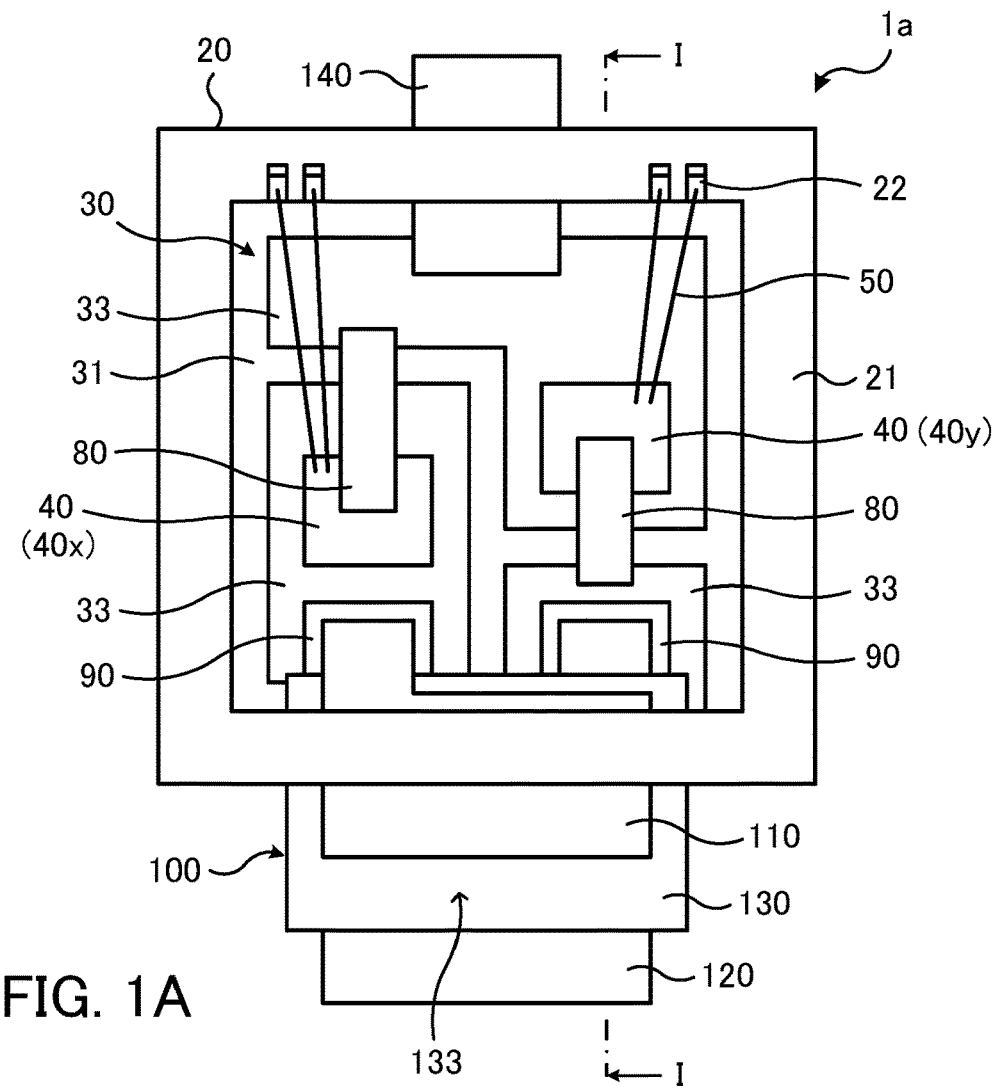
FIGS. 1A and 1B each illustrate an example of a semiconductor module.
Figure 1B:
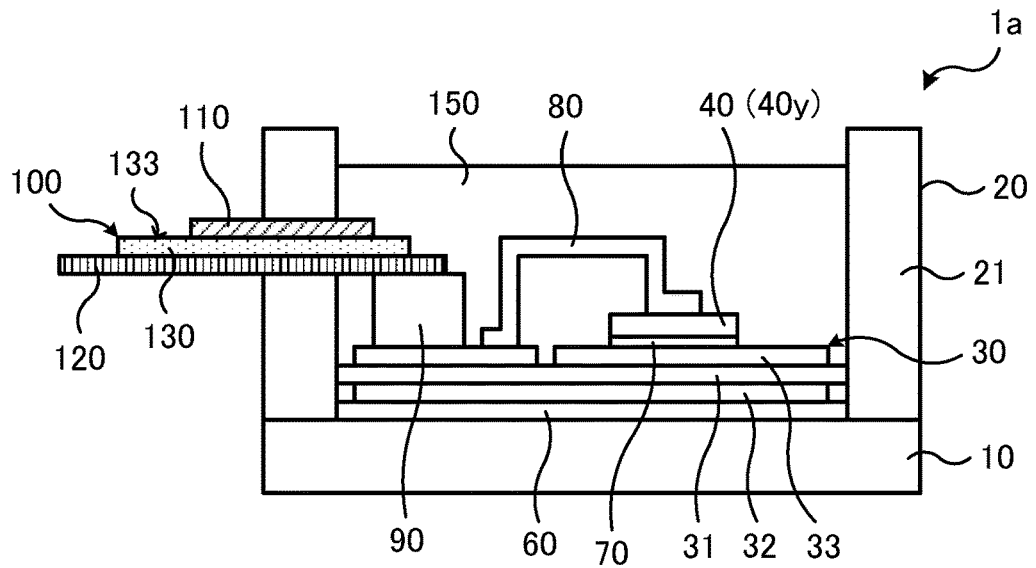

FIGS. 1A and 1B each illustrate an example of a semiconductor module. FIG. 1A is a plan view schematically illustrating a main part of an example of the semiconductor module. FIG. 1B is a sectional view schematically illustrating the main part of the example of the semiconductor module. Specifically, FIG. 1B is a schematic cross section taken along a line I-I in FIG. 1A. While sealing resin 150 is illustrated in FIG. 1B, the sealing resin 150 is not illustrated in FIG. 1A for convenience.

The semiconductor module 1a illustrated in FIGS. 1A and 1B includes a cooling member 10, a case 20, an insulating circuit board 30, and semiconductor chips 40.

For example, a metal plate such as a copper plate is used as the cooling member 10. The case 20 is disposed on the cooling member 10. For example, resin material such as polyphenylene sulfide resin, polybutylene terephthalate resin, polybutylene succinate resin, polyamide resin, or acrylonitrile butadiene styrene resin is used to form the case 20. For example, by performing injection molding with the above resin material, the case 20 of the semiconductor module 1a is formed. The case 20 has a frame-like peripheral wall 21. Terminals 22 connected to the semiconductor chips 40 via wires 50 are disposed on the peripheral wall 21. The case 20 is fixed to the cooling member 10 via adhesive or the like.

A cover that covers the internal space surrounded by the peripheral wall 21 may be disposed on the case 20. In addition, the cooling member 10 may include a cooling fin. Alternatively, an air-cooling or liquid-cooling cooler may be connected to the cooling member 10 directly or via thermal interface material or the like.

The insulating circuit board 30 and the semiconductor chips 40 are stored in the internal space surrounded by the peripheral wall 21 of the case 20. For example, the insulating circuit board 30 includes an insulating board 31 made of almina, complex ceramics containing almina as its main component, aluminum nitride, silicon nitride, or the like. In addition, a conductive layer 32 and conductive layers 33, such as predetermined copper patterns, are formed on two surfaces of the insulating board 31. A direct copper bonding (DCB) board is used as the insulating circuit board 30. Another board such as an active metal brazed (AMB) board may alternatively be used as the insulating circuit board 30. The conductive layer 32 formed on one surface of the insulating circuit board 30 is connected to the cooling member 10 via thermally conductive material 60 such as thermal interface material and is stored inside the case 20. The semiconductor chips 40 (two semiconductor chips 40 are illustrated as an example in FIGS. 1A and 1B) are mounted on their respective conductive layers 33 formed on the other surface of the insulating circuit board 30 via bonding material 70 such as sintered material or solder. For example, semiconductor elements such as IGBTs or MOSFETS are used for the semiconductor chips 40. For example, diode elements such as FWDs or Schottky barrier diodes (SBDs) are integrated on the semiconductor chips 40.

Each semiconductor chip 40 has one main surface (a lower surface in this example) on which a first load electrode (for example, a positive electrode) is formed and has the other main surface (an upper surface in this example) on which a second load electrode (for example, a negative electrode) and a control electrode are formed. For example, the first load electrode on the lower surface functions as a collector electrode or a drain electrode. In addition, the second load electrode on the upper surface functions as an emitter electrode or a source electrode, and the control electrode on the upper surface functions as a base electrode or a gate electrode.

The first load electrode on the lower surface of each semiconductor chip 40 is connected to a corresponding one of the conductive layers 33 of the insulating circuit board 30 via the corresponding bonding material 70. The second load electrode on the upper surface of one semiconductor chip 40 (40x) is connected to a conductive layer 33 via a conductive member 80 such as a wire, a clip, a tab, or a lead frame. The first load electrode on the lower surface of the other semiconductor chip 40 (40y) is connected to the above conductive layer 33. The second load electrodes and the control electrodes on the upper surfaces of the semiconductor chips 40 are connected to their respective terminals 22 of the case 20 via their respective wires 50. The conductive layer 33 connected to the first load electrode on the lower surface of one semiconductor chip 40 (40x) is connected to a first terminal 110 (for example, a positive (P) terminal) via a conductive block 90 made of copper or the like formed on this conductive layer 33. The second load electrode on the upper surface of the other semiconductor chip 40 (40y) is connected to another conductive layer 33 via a conductive member 80 and is connected to a second terminal 120 (for example, a negative (N) terminal) via a conductive block 90 formed on this conductive layer 33. An output terminal 140 is connected to the conductive layer 33 to which both the second load electrode on the upper surface of one semiconductor chip 40 (40x) and the first load electrode on the lower surface of the other semiconductor chip 40 (40y) are connected. In this example, the two semiconductor chips 40 (40x and 40y) are connected in series inside the case 20.

The semiconductor module 1a is an example of a 2-in-1 type semiconductor module that constitutes an inverter circuit. Between the two semiconductor chips 40 stored in the case 20, one semiconductor chip 40 (the semiconductor chip 40x) constitutes an upper arm in one phase, and the other semiconductor chip 40 (the semiconductor chip 40y) constitutes a lower arm in the same phase. For example, three semiconductor modules 1a, each of which includes a pair of semiconductor chips 40 connected in series as described above, are connected in parallel to each other. Nodes, each of which connects a corresponding pair of series-connected semiconductor chips 40 connected to a corresponding one of the terminals 140 of the three parallel-connected output semiconductor modules 1a, correspond to output nodes of the U phase, the V phase, and the W phase and are connected to load such as a motor.

FIGS. 1A and 1B each illustrate the semiconductor module 1a including one semiconductor chip 40 constituting an upper arm and the other semiconductor chip 40 constituting a lower arm inside the single case 20, for convenience of description. However, alternatively, the semiconductor module 1a may include a plurality of parallel-connected semiconductor chips 40 that constitute an upper arm and a plurality of parallel-connected semiconductor chips 40 that constitute a lower arm. The conductive layers 33, which have patterns based on the number of and the layout of semiconductor chips 40 to be mounted, are formed on the insulating circuit board 30.

The sealing resin 150 is formed in the internal space surrounded by the peripheral wall 21 of the case 20. The sealing resin 150 seals the insulating circuit board 30, the semiconductor chips 40, the wires 50, the conductive members 80, the conductive blocks 90, etc. stored in the case 20. In FIG. 1A, for convenience, the sealing resin 150 is not illustrated. For example, resin material such as epoxy resin or phenolic resin or gel material such as silicone is used as the sealing resin 150. The sealing resin 150 may contain insulating filler such as silica. A plurality of kinds of materials may be used as the sealing resin 150. For example, gel material such as silicone may be used as buffer coating material in a lower layer, and resin material such as epoxy resin may be used in an upper layer. That is, the sealing resin 150 may have a laminated structure.

As described above, in the semiconductor module 1a, the insulating circuit board 30 and the semiconductor chips 40 stored in the case 20 are electrically connected to the first terminal 110 functioning as a P terminal and the second terminal 120 functioning as an N terminal. The first terminal 110 and the second terminal 120 are disposed to partly overlap with each other in plan view and in sectional view, and an insulating sheet 130 is disposed between the first terminal 110 and the second terminal 120.

The first terminal 110 is connected to one conductive block 90 inside the case 20 and extends from the inside of the case 20 to the outside of the case 20. The second terminal 120 is connected to the other conductive block 90 inside the case 20 and extends from the inside of the case 20 to the outside of the case 20. The insulating sheet 130 is sandwiched between the first terminal 110 and the second terminal 120 and extends from the inside of the case 20 to the outside of the case 20. Outside the case 20, an extension-direction tip of the insulating sheet 130 is located farther away from the case 20 than an extension-direction tip of the first terminal 110 extending from the inside of the case 20 to the outside of the case 20. In addition, outside the case 20, an extension-direction tip of the second terminal 120 is located farther away from the case 20 than the extension-direction tip of the insulating sheet 130 extending from the inside of the case 20 to the outside of the case 20.

That is, the first terminal 110, the insulating sheet 130, and the second terminal 120 are disposed to form a staircase pattern outside the case 20 in their extension direction. A terrace portion 133 of the insulating sheet 130 is formed between the extension-direction tip of the first terminal 110 and the extension-direction tip of the insulating sheet 130. The insulating distance between the first terminal 110 and the second terminal 120 extending to the outside further than the extension-direction tip of the insulating sheet 130 is ensured by the distance from the extension-direction tip of the first terminal 110 to the extension-direction tip of the insulating sheet 130, that is, by the distance of the terrace portion 133 formed between these tips.

The semiconductor module 1a includes a laminated terminal portion 100 having the first terminal 110, the insulating sheet 130, and the second terminal 120 laminated as described above.

The semiconductor module 1a is connected to a capacitor, for example, to stabilize the DC volage applied.

Figure 2A:
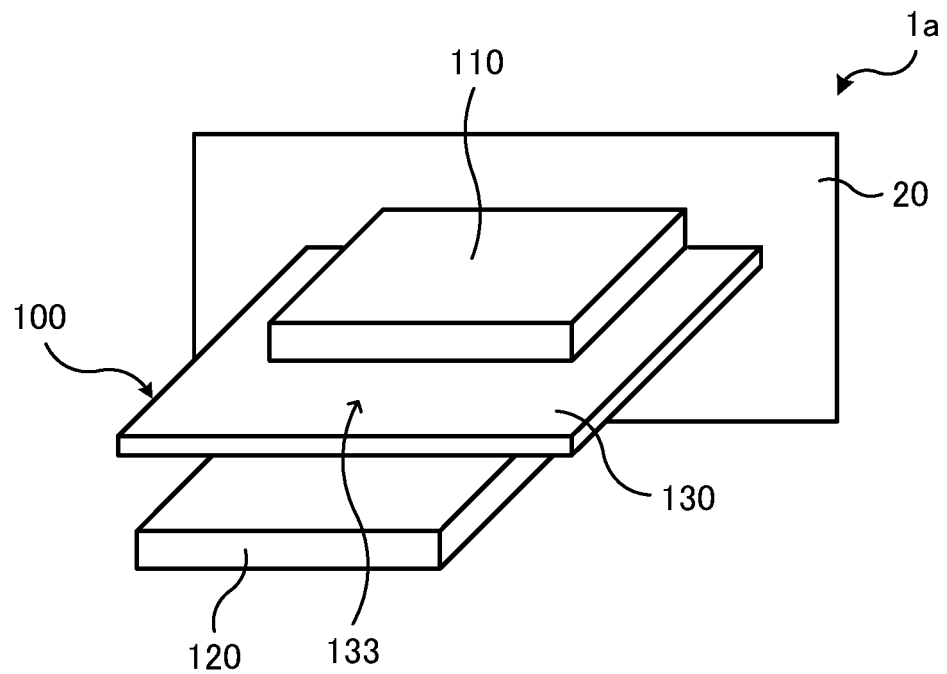
FIGS. 2A and 2B each illustrate an example of connection between the semiconductor module and a capacitor.
Figure 2B:
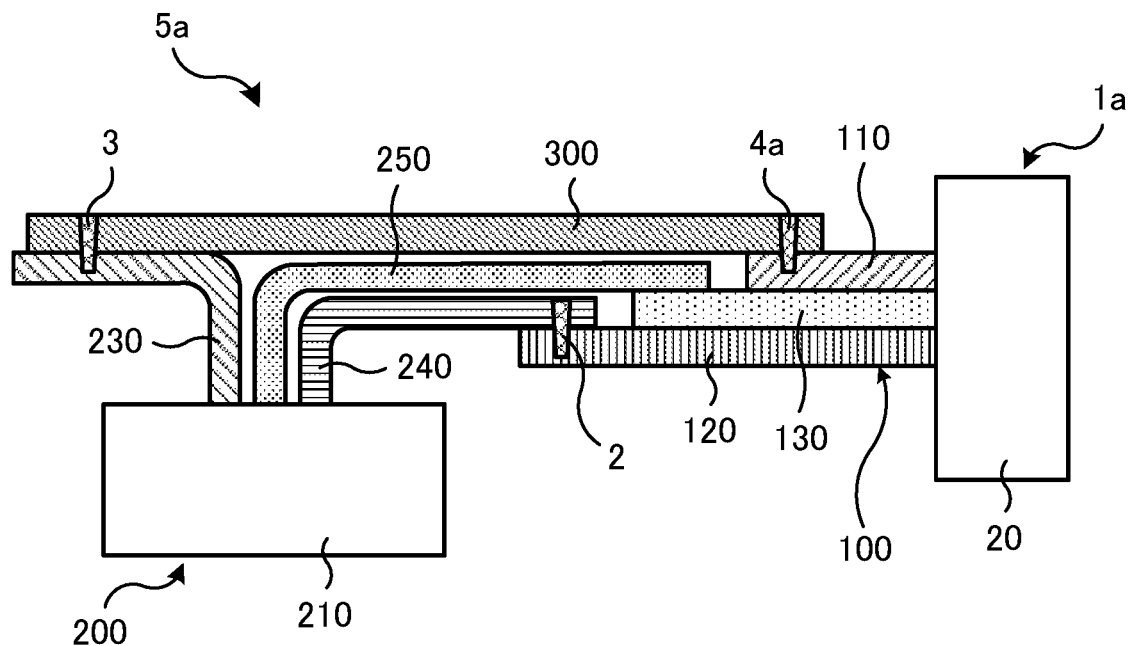

FIGS. 2A and 2B each illustrate an example of connection between the semiconductor module and a capacitor. FIG. 2A is a perspective view schematically illustrating a main part of an example of the laminated terminal portion of the semiconductor module. FIG. 2B is a sectional view schematically illustrating a main part of an example of connection portions between the semiconductor module and the capacitor.

As illustrated in FIG. 2A, the semiconductor module 1a includes the laminated terminal portion 100 extending from the case 20 to the outside. As described above, the laminated terminal portion 100 includes the insulating sheet 130 between the first terminal 110 and the second terminal 120. The first terminal 110, the insulating sheet 130, and the second terminal 120 are disposed to form a staircase pattern in their extension direction from the case 20. For example, the first terminal 110 is a P terminal of the semiconductor module 1a, and the second terminal 120 is an N terminal of the semiconductor module 1a. Metal material such as copper is used for the first terminal 110 and the second terminal 120. The surface of each of the first terminal 110 and the second terminal 120 may be plated with nickel or the like. Insulating resin material such as aramid resin, polyamide resin, fluorine resin, or polyimide resin is used for the insulating sheet 130.

As illustrated in FIG. 2B, the semiconductor module 1a is connected to the capacitor 200. The capacitor 200 includes a third terminal 230, a fourth terminal 240, and an insulating sheet 250 disposed therebetween, all of which extend from a case 210 to the outside. For example, the third terminal 230 is a P terminal of the capacitor 200, and the fourth terminal 240 is an N terminal of the capacitor 200. Metal material such as copper is used for each of the third terminal 230 and the fourth terminal 240. The surface of each of the third terminal 230 and the fourth terminal 240 may be plated with nickel or the like. Insulating resin material such as aramid resin, polyamide resin, fluorine resin, or polyimide resin is used for the insulating sheet 250.

For example, as illustrated in FIG. 2B, one end of the third terminal 230 is disposed at the case 210, and the other end of the third terminal 230 is bent. One end of the fourth terminal 240 is disposed at the case 210, and the other end of the fourth terminal 240 is bent in the opposite direction of the third terminal 230. One end of the insulating sheet 250 is disposed at the case 210 between the third terminal 230 and the fourth terminal 240. The insulating sheet 250 is flexible enough to be bent in the direction of the fourth terminal 240. The insulating sheet 250 is large enough to cover the fourth terminal 240 when bent in the direction of the fourth terminal 240.

The second terminal 120 of the semiconductor module 1a is directly connected to the fourth terminal 240 of the capacitor 200, and the first terminal 110 of the semiconductor module 1a is connected to the third terminal 230 of the capacitor 200 via a planar connection member 300. In this way, the semiconductor module 1a and the capacitor 200 are electrically connected to each other. To connect the semiconductor module 1a and the capacitor 200 to each other, first, the second terminal 120 and the fourth terminal 240 are connected to each other. Next, the insulating sheet 250 is bent to cover the connection portion. Next, after the connection member 300 is placed on the first terminal 110 and the third terminal 230, the connection member 300 is connected to the first terminal 110 and the third terminal 230. As a result, the negative and positive conductors of the semiconductor module 1a and the capacitor 200 are disposed in parallel to each other, with the insulating sheet 130 and the insulating sheet 250 sandwiched in between. Thus, the inductance at the individual joint portion is reduced.

The second terminal 120 of the semiconductor module 1a and the fourth terminal 240 of the capacitor 200 are connected to each other by laser welding. The laser welding may be performed by a seam laser technique in which a laser beam is continuously emitted or by a spot laser technique in which a pulsed laser beam is emitted. By emitting a laser beam to the second terminal 120 and the fourth terminal 240, the second terminal 120 and the fourth terminal 240 are melted at a welding location 2. When the welding location 2 is solidified, the second terminal 120 and the fourth terminal 240 are electrically connected to each other.

After the second terminal 120 of the semiconductor module 1a and the fourth terminal 240 of the capacitor 200 are connected to each other, the insulating sheet 250 of the capacitor 200 is bent in the direction of the welding location 2 where the second terminal 120 and the fourth terminal 240 are welded to each other. Since the insulating sheet 250 is bent in this way, the fourth terminal 240 and part of the second terminal 120 connected thereto are covered by the insulating sheet 250.

After the insulating sheet 250 of the capacitor 200 is bent, the first terminal 110 of the semiconductor module 1a and the third terminal 230 of the capacitor 200 are connected to each other via the connection member 300. Metal material such as copper is used for the connection member 300. For example, a bus bar is used for the connection member 300. The connection member 300 is placed over the bent insulating sheet 250 of the capacitor 200 and is connected to the first terminal 110 of the semiconductor module 1a and the third terminal 230 of the capacitor 200.

The first terminal 110 of the semiconductor module 1a and the third terminal 230 of the capacitor 200 are connected to the connection member 300 by laser welding, for example. The laser welding may be performed by a seam laser technique or a spot laser technique. By emitting a laser beam to the third terminal 230 and the connection member 300, the third terminal 230 and the connection member 300 are melted at a welding location 3. When the welding location 3 is solidified, the third terminal 230 and the connection member 300 are electrically connected to each other. In addition, by emitting a laser beam to the first terminal 110 and the connection member 300, the first terminal 110 and the connection member 300 are melted at a welding location 4a. When the welding location 4a is solidified, the first terminal 110 and the connection member 300 are electrically connected to each other.

For example, the semiconductor module 1a and the capacitor 200 are connected to each other via the connection member 300 as described above, and as a result, a semiconductor device 5a as illustrated in FIG. 2B is obtained.

Next, laser welding between the first terminal 110 of the semiconductor module 1a and the connection member 300 will be described.

Figure 3A:
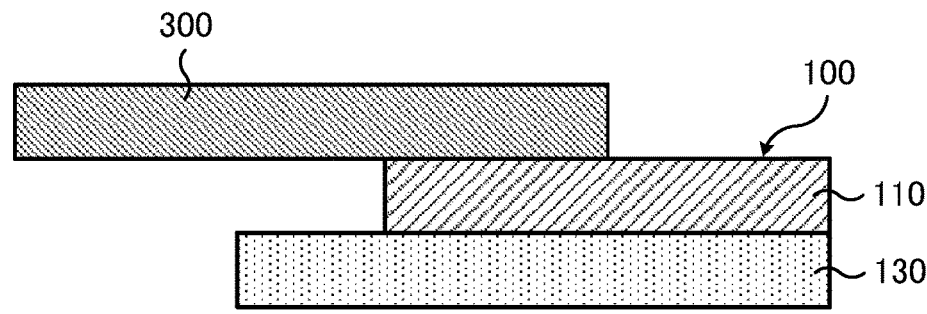
FIGS. 3A to 3C each illustrate laser welding between a terminal of the semiconductor module and a connection member.
Figure 3B:
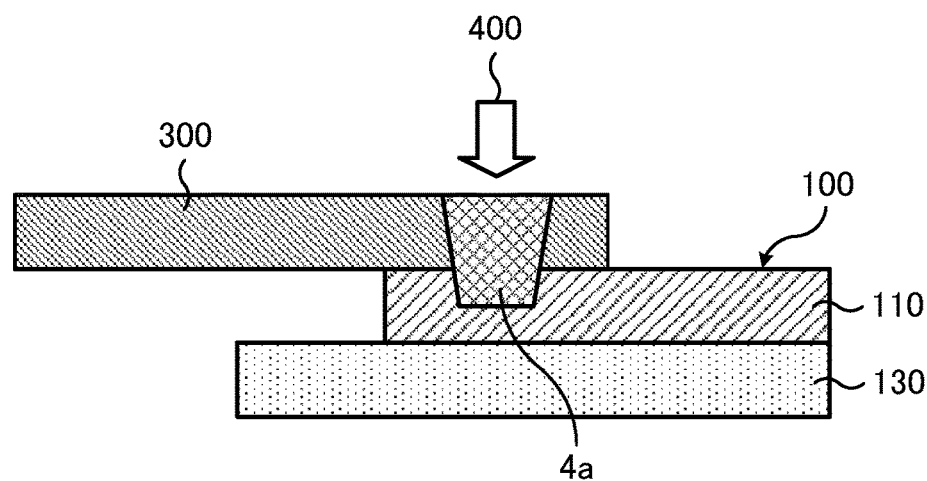
Figure 3C:
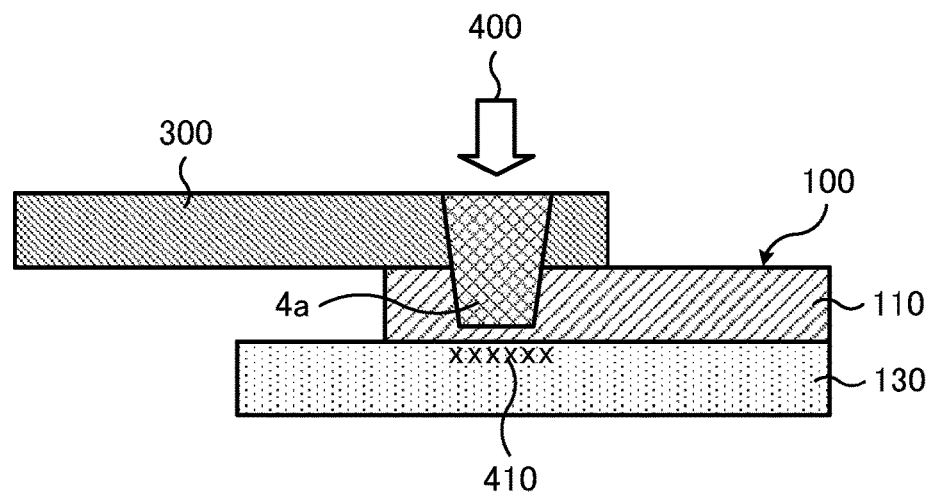

FIGS. 3A to 3C each illustrate laser welding between the first terminal of the semiconductor module and the connection member. FIGS. 3A to 3C are each a sectional view schematically illustrating a main part of an example of a laser welding step.

FIGS. 3A to 3C each illustrate the insulating sheet 130 and the first terminal 110 of the laminated terminal portion 100 of the semiconductor module 1a and the connection member 300, for convenience. To connect the first terminal 110 and the connection member 300 by laser welding, for example, the connection member 300 is first placed on the first terminal 110, as illustrated in FIG. 3A. Next, as illustrated in FIG. 3B, a laser beam 400 is emitted to the connection member 300. The connection member 300 and the first terminal 110 thereunder are consequently melted at the welding location 4a. When the welding location 4a is solidified, and the connection member 300 and the first terminal 110 are consequently welded.

However, when laser welding is performed in this way, there are cases in which the emission of the laser beam 400 generates excessive heat. If this happens, the connection member 300 and the first terminal 110 are excessively melted. As a result, as illustrated in FIG. 3C, the insulating sheet 130 is subjected to thermal stress, and damage 410 is caused on the insulating sheet 130. If the first terminal 110 is excessively melted and if the welding location 4a penetrates through the first terminal 110 into the insulating sheet 130, the damage 410 could be caused inside the insulating sheet 130. If the damage 410 is caused inside the insulating sheet 130, material properties of the insulating sheet 130 at or around the damage 410 change, and the original insulating performance of the insulating sheet 130 is unable to be maintained. Consequently, the dielectric strength could be deteriorated.

In view of the above point, configurations described as the following embodiments are adopted, to prevent occurrence of damage to the insulating sheet when the connection member is welded to the terminal of the semiconductor module.

First Embodiment

Figure 4A:
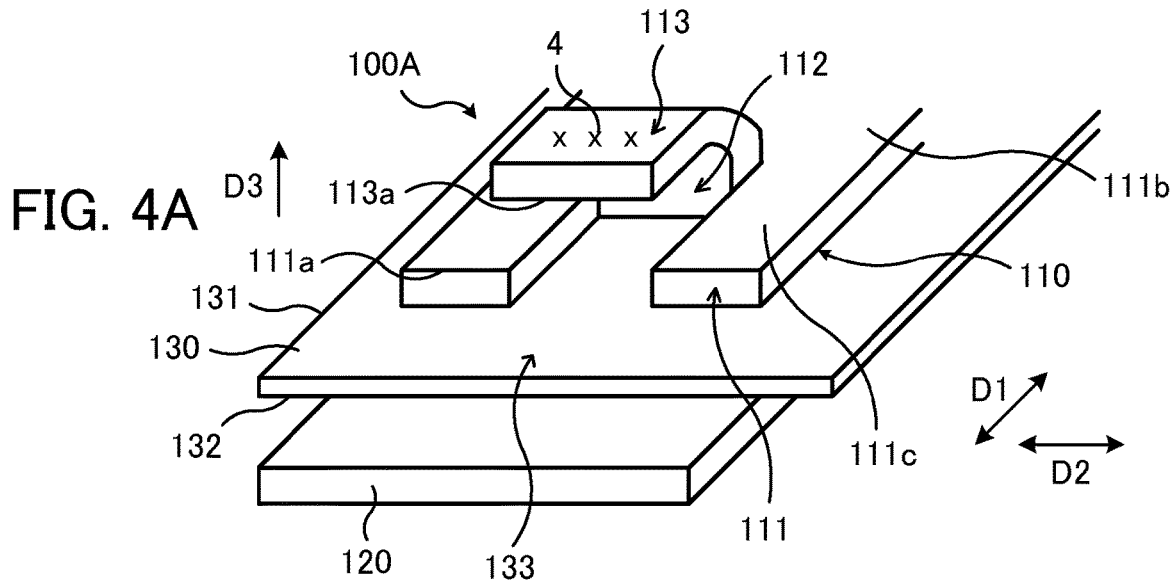
FIGS. 4A to 4C each illustrate an example of a laminated terminal portion of a semiconductor module according to a first embodiment.
Figure 4B:
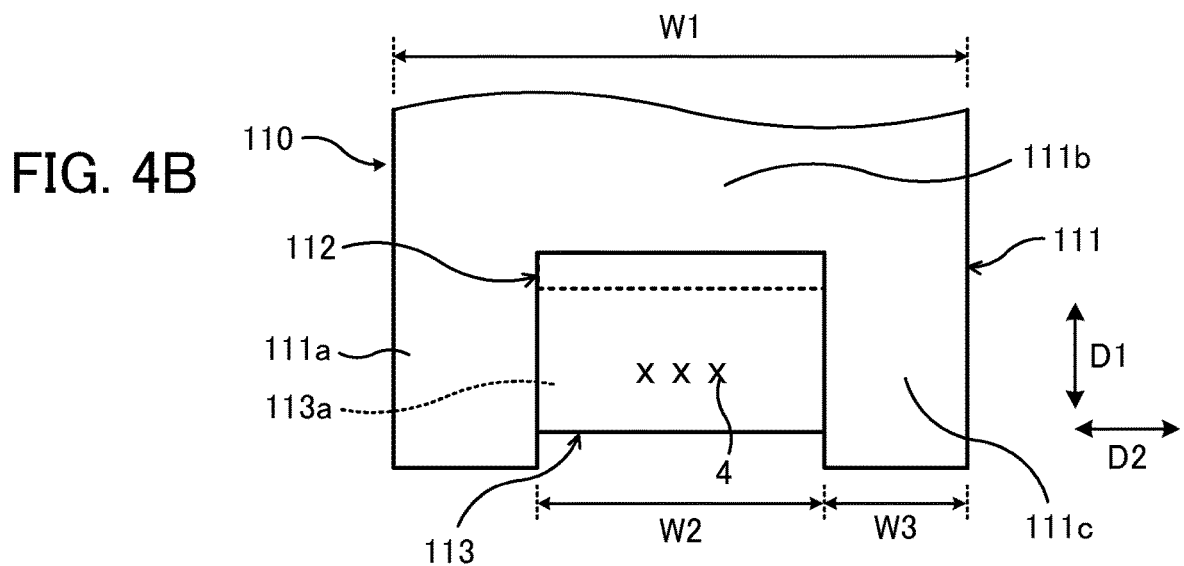
Figure 4C:
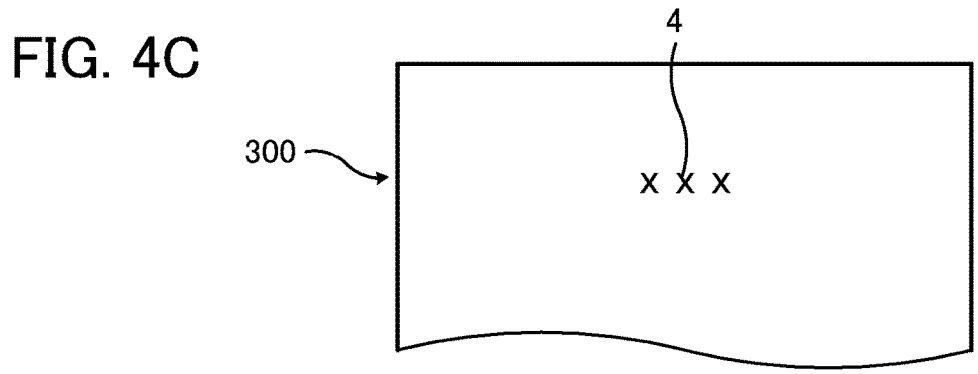

FIGS. 4A to 4C each illustrate an example of a laminated terminal portion of a semiconductor module according to a first embodiment. FIG. 4A is a perspective view schematically illustrating a main part of an example of the laminated terminal portion of the semiconductor module. FIG. 4B is a plan view schematically illustrating a main part of an example of a first terminal of the laminated terminal portion of the semiconductor module. FIG. 4C is a plan view schematically illustrating a main part of an example of a connection member welded to the first terminal of the laminated terminal portion of the semiconductor module.

Figure 5A:
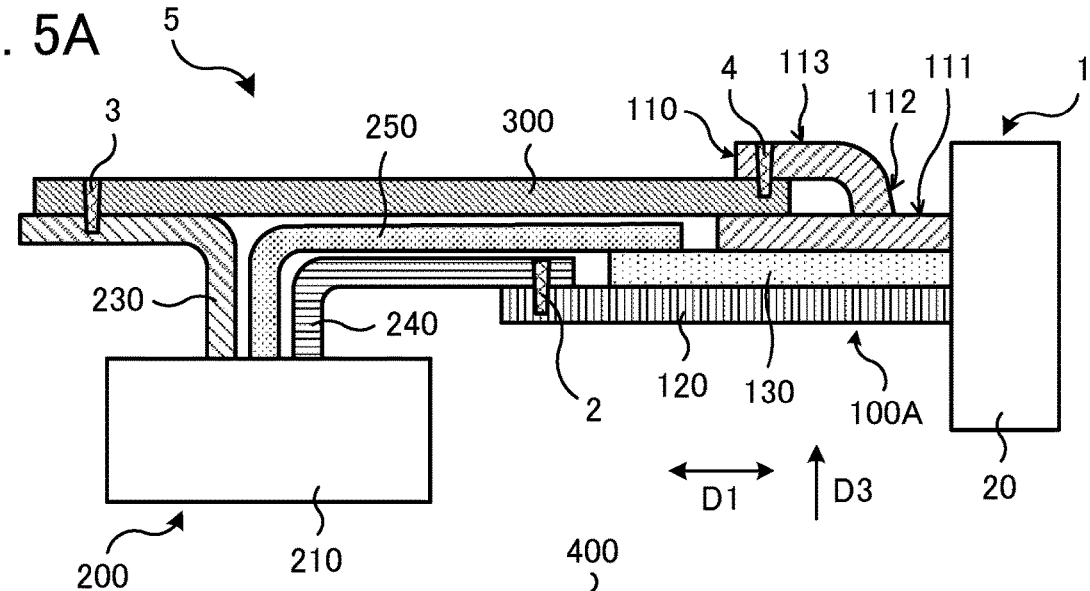
FIGS. 5A to 5C each illustrate an example of connection between the semiconductor module according to the first embodiment and a capacitor.
Figure 5B:
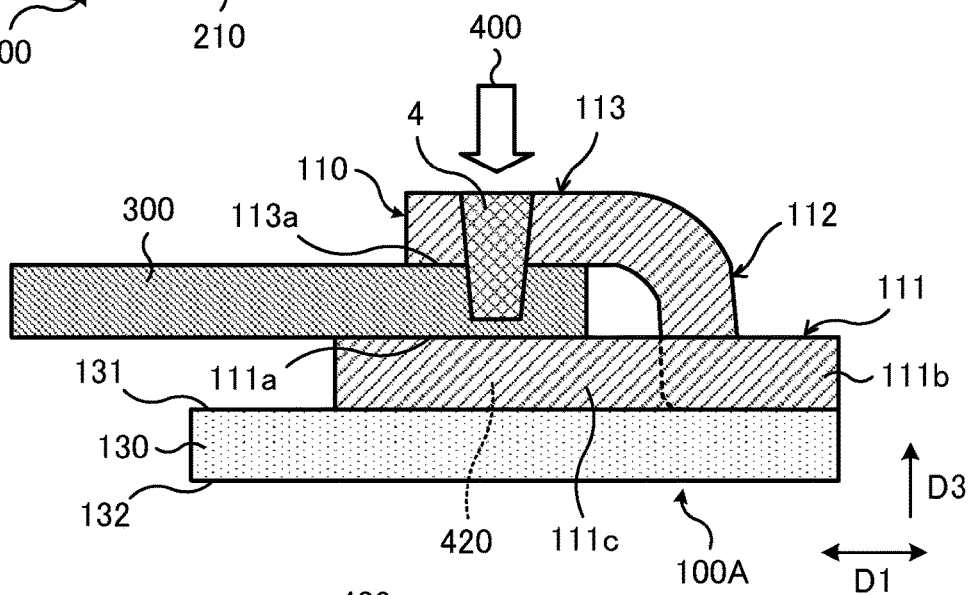
Figure 5C:
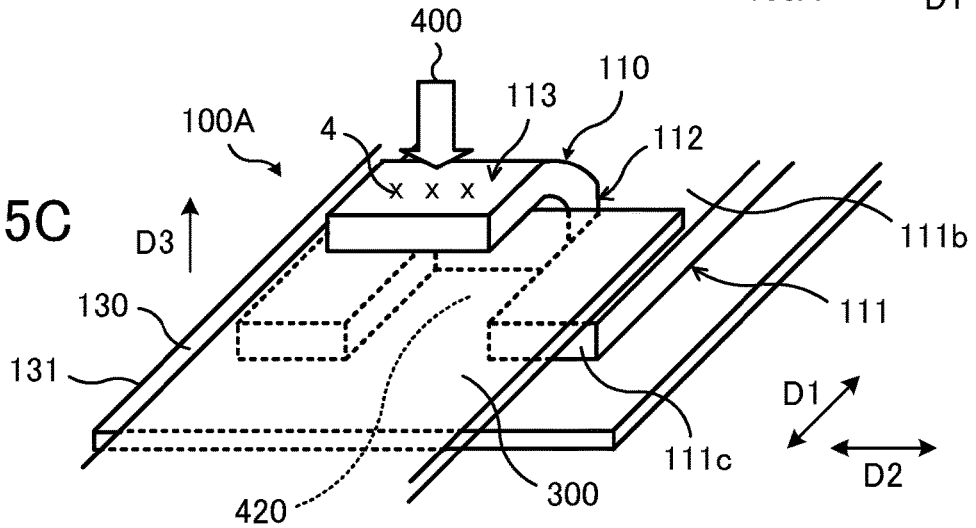

The laminated terminal portion 100A illustrated in FIG. 4A includes the first terminal 110, a second terminal 120, and an insulating sheet 130. The insulating sheet 130 is disposed between the first terminal 110 and the second terminal 120. The first terminal 110 is disposed on a first surface 131 of the insulating sheet 130, and the second terminal 120 is disposed on a second surface 132, which is the surface opposite to the first surface 131 of the insulating sheet 130. The first terminal 110 and the second terminal 120 are disposed to partly overlap with each other via the insulating sheet 130. That is, the first terminal 110 and the second terminal 120 partly overlap with each other in plan view. The first terminal 110, the second terminal 120, and the insulating sheet 130 are disposed to extend from a case 20 of the semiconductor module 1 to the outside, as illustrated in FIGS. 5A to 5C. The first terminal 110, the insulating sheet 130, and the second terminal 120 are disposed to form a staircase pattern in a first direction D1 (the extension direction from the case 20 to the outside). The insulating distance between the first terminal 110 and the second terminal 120 is ensured by a terrace portion 133 formed on the insulating sheet 130.

The first terminal 110 of the laminated terminal portion 100A has a first region 111, a second region 112, and a third region 113, as illustrated in FIGS. 4A and 4B. The first region 111 is disposed on the first surface 131 of the insulating sheet 130 extending in the first direction D1 and has a first width W1 in a second direction D2 perpendicular to the first direction D1 in plan view. The second region 112 extends from the first region 111 and has a second width W2 in the second direction D2 in plan view. The second width W2 is narrower than the first width W1. The second region 112 is perpendicular to the first surface 131 of the insulating sheet 130 and extends from the first region 111 in a third direction D3, which is away from the first surface 131. The third region 113 is located away from the first surface 131 of the insulating sheet 130 and is electrically connected to the first region 111 and the second region 112.

In the laminated terminal portion 100A, in the third direction D3, a surface 111a (the upper surface) of the first region 111, the surface 111a facing in a direction opposite to the direction of the insulating sheet 130, is located closer to the insulating sheet 130 than a surface 113a (the lower surface) of the third region 113, the surface 113a facing in the direction of the insulating sheet 130. In the laminated terminal portion 100A, the third region 113 of the first terminal 110 is disposed outside the first region 111 in plan view. That is, the third region 113 is disposed such that the third region 113 does not overlap with the first region 111 in plan view.

The first region 111 of the first terminal 110 of the laminated terminal portion 100A has a wide portion 111b having the first width W1 in the second direction D2. The first region 111 also has a pair of narrow portions 111c, each of which extends from the wide portion 111b in the first direction D1 and has a third width W3 narrower than the first width W1 in the second direction D2. These narrow portions 111c are disposed away from each other at end portions of the wide portion 111b in the second direction D2. The second region 112 extends from an edge portion of the wide portion 111b of the first region 111 located in the first direction D1 between the narrow portions 111c, and the third region 113 extends in the first direction D1 from the second region 112 such that the third region 113 does not overlap with the first region 111 in plan view.

The first terminal 110 of the laminated terminal portion 100A may be formed by forming two cuts extending in the first direction D1 in edge portions of a planar terminal member in the first direction D1 by punching or the like, bending the middle portion between the two cuts in the third direction D3 once, and bending a tip portion of the bent middle portion in the first direction D1 (such that the tip portion does not overlap with the planar terminal member in plan view).

As described above, in the case of the first terminal 110 of the laminated terminal portion 100A, the pair of narrow portions 111c extend from the wide portion 111b of the first region 111 in the first direction D1, and the second region 112 extends from the edge portion of the wide portion 111b located in the first direction D1 (between the pair of narrow portions 111c) in the third direction D3. In addition, the third region 113 extends from the second region 112 in the first direction D1 at a location higher than the wide portion 111b and the narrow portions 111c of the first region 111 via the second region 112 with respect to the insulating sheet 130 such that the third region 113 does not overlap with the first region 111 in plan view.

The connection member 300 such as a bus bar as illustrated in FIG. 4C is welded to the first terminal 110 of the laminated terminal portion 100A and a capacitor 200, for example. An end portion of the connection member 300 is inserted between the narrow portions 111c of the first region 111 and the third region 113 of the first terminal 110. Next, a laser beam is emitted to the third region 113 to weld the third region 113 and the connection member 300 with each other at a welding location 4.

FIGS. 5A to 5C each illustrate an example of connection between the semiconductor module according to the first embodiment and the capacitor. FIG. 5A is a sectional view schematically illustrating a main part of an example of connection portions between the semiconductor module and the capacitor. FIG. 5B is a sectional view schematically illustrating a main part of an example of a laser welding step performed on the first terminal of the laminated terminal portion of the semiconductor module and the connection member. FIG. 5C is a perspective view schematically illustrating a main part of an example of a connection state between the first terminal of the laminated terminal portion of the semiconductor module and the connection member.

As illustrated in FIG. 5A, the laminated terminal portion 100A of the semiconductor module 1 is disposed to extend in the first direction D1 from the case 20 to the outside. For example, the first terminal 110 is a P terminal, and the second terminal 120 is an N terminal. The insulating sheet 130 is disposed between the first terminal 110 and the second terminal 120.

The capacitor 200 connected to the semiconductor module 1 includes a third terminal 230, a fourth terminal 240, and an insulating sheet 250 disposed therebetween, all of which extend from a case 210 to the outside. For example, the third terminal 230 is a P terminal, and the fourth terminal 240 is an N terminal. The insulating sheet 250 having flexibility is disposed between the third terminal 230 and the fourth terminal 240.

To connect the semiconductor module 1 and the capacitor 200 with each other, first, the fourth terminal 240 of the capacitor 200 is placed on the second terminal 120 of the laminated terminal portion 100A of the semiconductor module 1. Next, a laser beam is emitted to the fourth terminal 240, to weld the fourth terminal 240 and the second terminal 120 at a welding location 2. Next, the insulating sheet 250 of the capacitor 200 is bent such that the fourth terminal 240 and the welding location 2 where the fourth terminal 240 and the second terminal 120 are welded to each other are covered by the insulating sheet 250.

Next, one end portion of the connection member 300 is inserted between the narrow portions 111c (the surface 111a) of the first region 111 and the third region 113 (the surface 113a) of the first terminal 110 of the laminated terminal portion 100A of the semiconductor module 1. The other end portion of the connection member 300 is placed on the third terminal 230 of the capacitor 200. If the extension-direction tip of the individual narrow portion 111c of the first region 111 of the first terminal 110 is formed to protrude more than the extension-direction tip of the third region 113, the connection member 300 is inserted more easily between the narrow portions 111c and the third region 113 without bumping into the insulating sheet 130.

After the connection member 300 is placed, a laser beam is emitted to the other end portion of the connection member 300 placed on the third terminal 230, to weld the connection member 300 and the third terminal 230 at a welding location 3. Next, a laser beam is emitted to the third region 113. At this point of time, one end portion of the connection member 300 has already been inserted between the third region 113 and the first region 111 of the first terminal 110 of the laminated terminal portion 100A. As a result, the third region 113 of the first terminal 110 and the connection member 300 are welded at the welding location 4. Alternatively, the welding at the welding location 4 may be performed after the welding at the welding location 3.

For example, in this way, the semiconductor module 1 having the laminated terminal portion 100A is connected to the capacitor 200 by using the connection member 300. As a result, the semiconductor device 5 as illustrated in FIG. 5A is obtained.

To weld the third region 113 of the first terminal 110 of the laminated terminal portion 100A to the connection member 300, a laser beam 400 is emitted to the third region 113 as illustrated in FIGS. 5B and 5C, and the third region 113 and the connection member 300 thereunder are consequently melted. When the melted portion is solidified, the third region 113 and the connection member 300 are consequently welded at the welding location 4.

In this laser welding described above, the third region 113 of the first terminal 110 is lifted from the first region 111 on the insulating sheet 130 to a location away from the insulating sheet 130 via the second region 112. The connection member 300 is inserted between the lifted third region 113 and the narrow portions 111c of the first region 111, and the third region 113 and the connection member 300 are welded to each other. There is a space 420 corresponding to at least the thickness of the first region 111 between the connection member 300, which is welded to the third region 113, and the insulating sheet 130. Thus, since the heat generated in the connection member 300 by the emission of the laser beam 400 to the third region 113 is insulated by the space 420, the heat is not directly transferred to the insulating sheet 130. As a result, the insulating sheet 130 is prevented from being damaged by the heat generated by the welding. Since the insulating sheet 130 is prevented from being damaged, the material properties of the insulating sheet 130 are prevented from being changed. Thus, since deterioration in insulating performance is prevented, deterioration in dielectric strength is prevented.

Second Embodiment

Figure 6A:
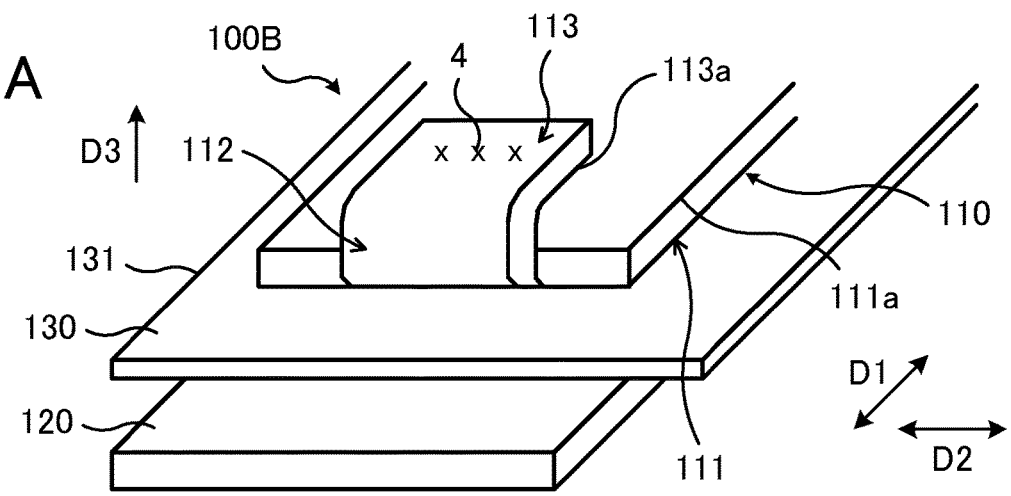
FIGS. 6A to 6C each illustrate an example of a laminated terminal portion of a semiconductor module according to a second embodiment.
Figure 6B:
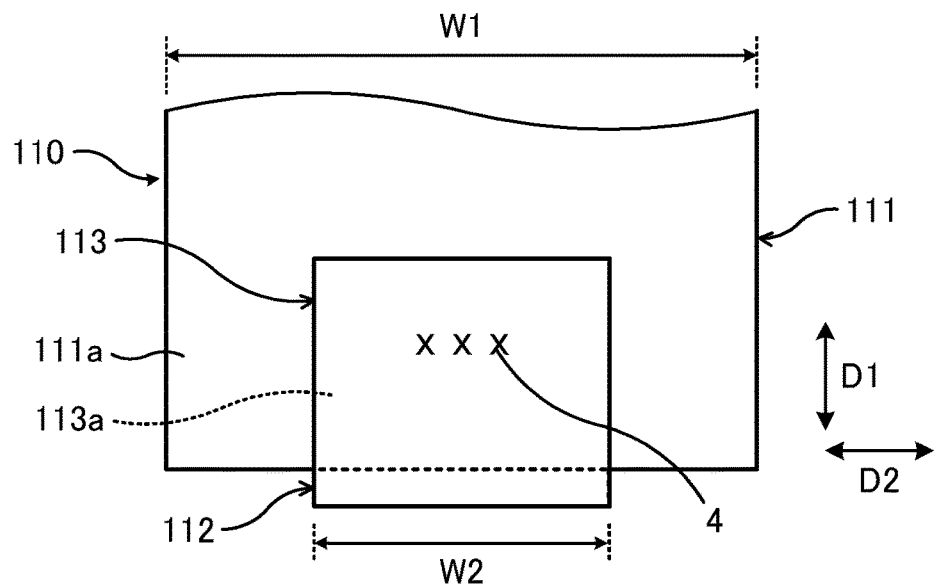
Figure 6C:
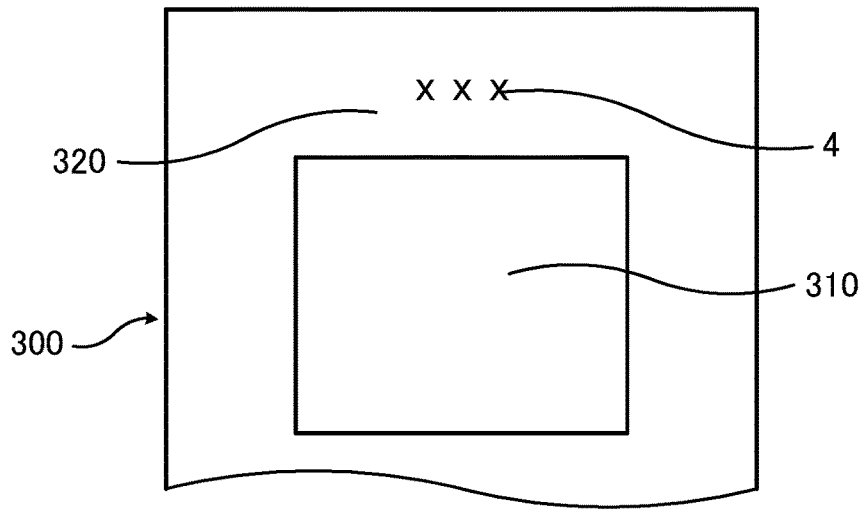

FIGS. 6A to 6C each illustrate an example of a laminated terminal portion of a semiconductor module according to a second embodiment. FIG. 6A is a perspective view schematically illustrating a main part of an example of the laminated terminal portion of the semiconductor module. FIG. 6B is a plan view schematically illustrating a main part of an example of a first terminal of the laminated terminal portion of the semiconductor module. FIG. 6C is a plan view schematically illustrating a main part of an example of a connection member welded to the first terminal of the laminated terminal portion of the semiconductor module.

The laminated terminal portion 100B according to the second embodiment includes the first terminal 110 having a first region 111, a second region 112, and a third region 113 as illustrated in FIGS. 6A and 6B. The first region 111 of the first terminal 110 of the laminated terminal portion 100B is disposed on a first surface 131 of an insulating sheet 130 extending in a first direction D1 and has a first width W1 in a second direction D2 perpendicular to the first direction D1 in plan view. The second region 112 extends from the first region 111 and has a second width W2 narrower than the first width W1 in the second direction D2 in plan view. The second region 112 is perpendicular to the first surface 131 of the insulating sheet 130 and extends from the first region 111 in a third direction D3, which is away from the first surface 131. The third region 113 is located away from the first surface 131 of the insulating sheet 130 and is electrically connected to the first region 111 and the second region 112.

In the case of the laminated terminal portion 100B, in the third direction D3, a surface 111a (the upper surface) of the first region 111, the surface 111a facing in a direction opposite to the direction of the insulating sheet 130, is located closer to the insulating sheet 130 than a surface 113*a* (the lower surface) of the third region 113, the surface 113*a* facing in the direction of the insulating sheet 130. The third region 113 of the first terminal 110 of the laminated terminal portion 100B is disposed to overlap with the first region 111 in plan view.

The first terminal 110 of the laminated terminal portion 100B may be formed by performing punching or the like on a planar terminal member to form a protruding portion that protrudes in the first direction D1, bending the protruding portion in the third direction D3 once, and bending a tip portion of the bent protruding portion in the first direction D1 (such that the tip portion overlaps with the planar terminal member in plan view).

As described above, the second region 112 of the first terminal 110 of the laminated terminal portion 100B extends from an edge portion (a center edge portion) of the first region 111, the edge portion being located in the first direction D1, in the third direction D3. In addition, the third region 113 extends from the second region 112 in the first direction D1 at a location higher than the first region 111 via the second region 112 with respect to the insulating sheet 130 such that the third region 113 overlaps with the first region 111 in plan view.

For example, the connection member 300 such as a bus bar as illustrated in FIG. 6C is welded to the first terminal 110 of the laminated terminal portion 100B. The connection member 300 welded to the first terminal 110 of the laminated terminal portion 100B has a planar penetration portion 310 (an opening portion) through which the third region 113 and the second region 112 of the first terminal 110 penetrate.

To weld the first terminal 110 of the laminated terminal portion 100B as illustrated in FIGS. 6A and 6B and the connection member 300 as illustrated in FIG. 6C, first, the connection member 300 is placed on the first terminal 110 such that the third region 113 and the second region 112 are inserted into the penetration portion 310 of the connection member 300. Next, the connection member 300 is slid in the first direction D1 such that an end portion 320 of the connection member 300 is sandwiched between the third region 113 and the first region 111 of the first terminal 110. As a result, the end portion 320 of the connection member 300 is inserted between the first region 111 and the third region 113 of the first terminal 110. The second region 112 penetrates through the penetration portion 310 from the upper and lower surfaces of the connection member 300. After the connection member 300 is placed, a laser beam is emitted to the third region 113 of the first terminal 110, and the third region 113 and the connection member 300 thereunder are melted. When the melted portion is solidified, and the third region 113 and the connection member 300 are consequently welded to each other at a welding location 4.

In this laser welding described above, the third region 113 of the first terminal 110 is lifted from the first region 111 on the insulating sheet 130 to a location away from the insulating sheet 130 via the second region 112. The end portion 320 of the connection member 300 is inserted between the lifted third region 113 and the first region 111 thereunder, and the third region 113 and the connection member 300 are welded to each other. Since the connection member 300 is located away from the insulating sheet 130 and there is the first region 111 under the connection member 300, the heat generated in the connection member 300 by the emission of the laser beam to the third region 113 is not directly transferred to the insulating sheet 130. As a result, the insulating sheet 130 is prevented from being damaged by the heat generated by the welding. Since the insulating sheet 130 is prevented from being damaged, the material properties of the insulating sheet 130 are prevented from being changed. Thus, since deterioration in insulating performance is prevented, deterioration in dielectric strength is prevented.

Third Embodiment

Figure 7A:
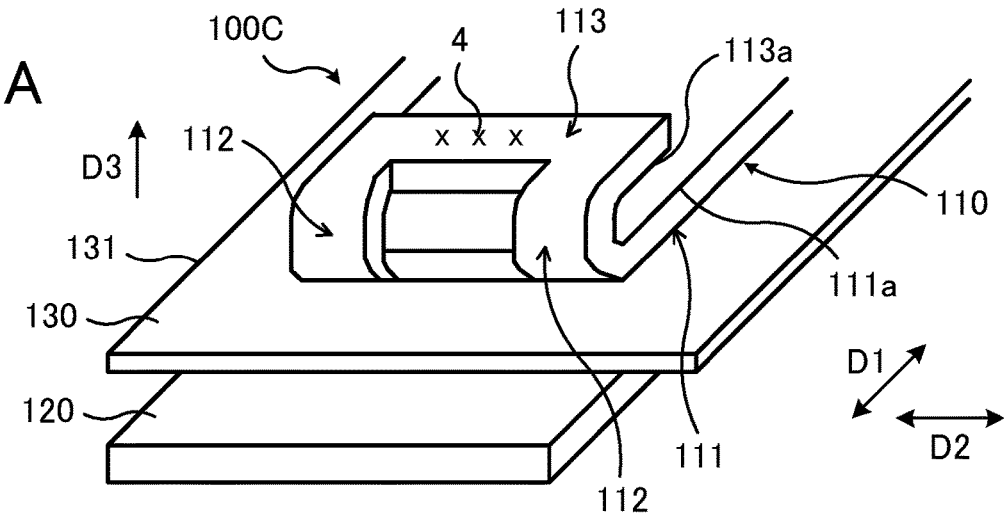
FIGS. 7A to 7C each illustrate an example of a laminated terminal portion of a semiconductor module according to a third embodiment.
Figure 7B:
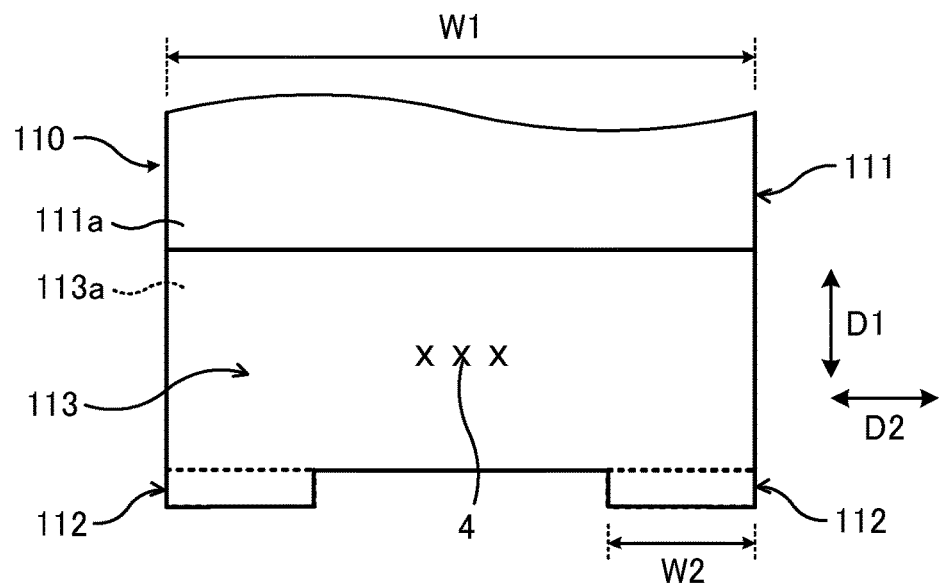
Figure 7C:
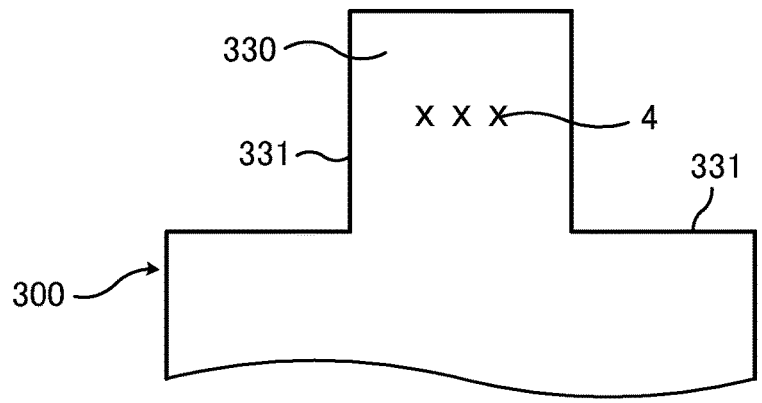

FIGS. 7A to 7C each illustrate an example of a laminated terminal portion of a semiconductor module according to a third embodiment. FIG. 7A is a perspective view schematically illustrating a main part of an example of the laminated terminal portion of the semiconductor module. FIG. 7B is a plan view schematically illustrating a main part of an example of a first terminal of the laminated terminal portion of the semiconductor module. FIG. 7C is a plan view schematically illustrating a main part of an example of a connection member welded to the first terminal of the laminated terminal portion of the semiconductor module.

The laminated terminal portion 100C according to the third embodiment includes the first terminal 110 having a first region 111, a pair of second regions 112, and a third region 113 as illustrated in FIGS. 7A and 7B. The first region 111 of the first terminal 110 of the laminated terminal portion 100C is disposed on a first surface 131 of an insulating sheet 130 extending in a first direction D1 and has a first width W1 in a second direction D2 perpendicular to the first direction D1 in plan view. The second regions 112 each extend from the first region 111 and have a second width W2 narrower than the first width W1 in the second direction D2 in plan view. The second regions 112 are each perpendicular to the first surface 131 of the insulating sheet 130 and each extend from the first region 111 in a third direction D3, which is away from the first surface 131. The third region 113 is located away from the first surface 131 of the insulating sheet 130 and is electrically connected to the first region 111 and the second regions 112.

In the case of the laminated terminal portion 100C, in the third direction D3, a surface 111*a* (the upper surface) of the first region 111, the surface 111*a* facing in a direction opposite to the direction of the insulating sheet 130, is located closer to the insulating sheet 130 than a surface 113*a* (the lower surface) of the third region 113, the surface 113*a* facing in the direction of the insulating sheet 130. The third region 113 of the first terminal 110 of the laminated terminal portion 100C is disposed to overlap with the first region 111 in plan view.

The first terminal 110 of the laminated terminal portion 100C includes the pair of second regions 112 disposed away from each other at end portions of the first region 111 in the second direction D2. The third region 113 is connected to the pair of second regions 112.

The first terminal 110 of the laminated terminal portion 100C may be formed by forming an opening portion in a planar terminal member by punching or the like, bending the opening portion in the third direction D3 once, and bending a tip portion of the bent opening portion in the first direction D1 (such that the tip portion overlaps with the planar terminal member in plan view).

As described above, in the case of the first terminal 110 of the laminated terminal portion 100C, the pair of second regions 112 extend from edge portions (two end portions) of the first region 111, the edge portions being located in the first direction D1, in the third direction D3. In addition, the third region 113 extends from the pair of second regions 112 in the first direction D1 at a location higher than the first region 111 via the pair of second regions 112 with respect to the insulating sheet 130 such that the third region 113 overlaps with the first region 111 in plan view.

For example, the connection member 300 such as a bus bar as illustrated in FIG. 7C is welded to the first terminal 110 of the laminated terminal portion 100C. The connection member 300 welded to the first terminal 110 of the laminated terminal portion 100C has a planar protruding portion 330, which is inserted into the gap (the opening portion) between the pair of second regions 112.

To weld the first terminal 110 of the laminated terminal portion 100C as illustrated in FIGS. 7A and 7B and the connection member 300 as illustrated in FIG. 7C, first, the connection member 300 is placed on the first terminal 110 such that the protruding portion 330 of the connection member 300 is inserted into the gap between the pair of second regions 112. Consequently, the protruding portion 330 of the connection member 300 is inserted between the first region 111 and the third region 113 of the first terminal 110. Cut portions 331 sandwiching the protruding portion 330 of the connection member 300 may be referred to as penetration portions where the second regions 112 penetrate the upper and lower surfaces of the connection member 300. After the connection member 300 is placed, a laser beam is emitted to the third region 113 of the first terminal 110, and the third region 113 and the connection member 300 thereunder are melt. When the melted portion is solidified, the third region 113 and the connection member 300 are consequently welded to each other at a welding location 4.

In this laser welding described above, the third region 113 of the first terminal 110 is lifted from the first region 111 on the insulating sheet 130 to a location away from the insulating sheet 130 via the second region 112. The protruding portion 330 of the connection member 300 is inserted between the lifted third region 113 and the first region 111 thereunder, and the third region 113 and the connection member 300 are welded to each other. Since the connection member 300 is located away from the insulating sheet 130 and there is the first region 111 under the connection member 300, the heat generated in the connection member 300 by the emission of the laser beam to the third region 113 is not directly transferred to the insulating sheet 130. As a result, the insulating sheet 130 is prevented from being damaged by the heat generated by the welding. Since the insulating sheet 130 is prevented from being damaged, the material properties of the insulating sheet 130 are prevented from being changed. Thus, since deterioration in insulating performance is prevented, deterioration in dielectric strength is prevented.

The connection member 300 welded to the first terminal 110 of the laminated terminal portion 100C may have a shape different from that illustrated in FIG. 7C. For example, a connection member 300 having a certain width insertable into the gap between the pair of second regions 112 may be used. That is, a connection member 300 having a certain width corresponding to the width of the above protruding portion 330 may be used.

Fourth Embodiment

Figure 8A:
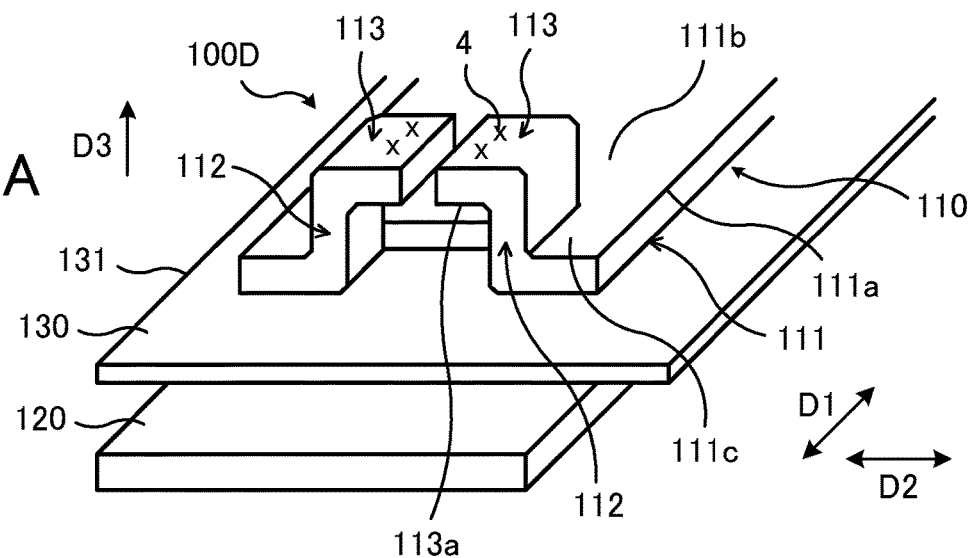
FIGS. 8A to 8C each illustrate an example of a laminated terminal portion of a semiconductor module according to a fourth embodiment.
Figure 8B:
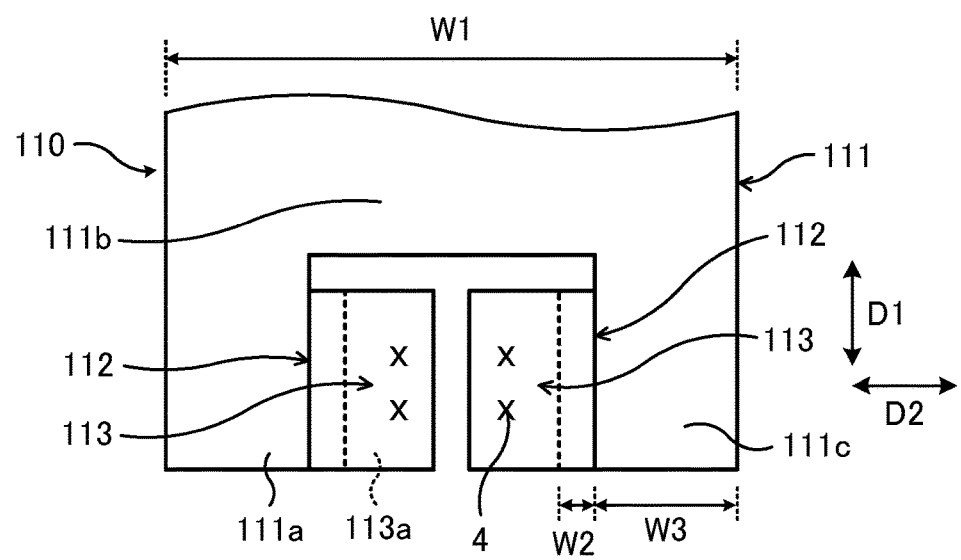
Figure 8C:
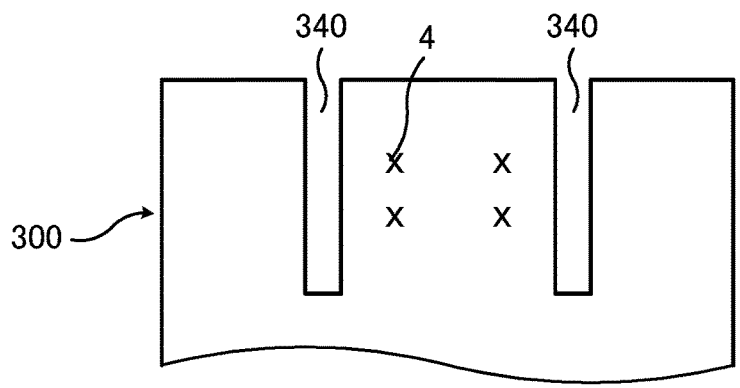

FIGS. 8A to 8C each illustrate an example of a laminated terminal portion of a semiconductor module according to a fourth embodiment. FIG. 8A is a perspective view schematically illustrating a main part of an example of the laminated terminal portion of the semiconductor module. FIG. 8B is a plan view schematically illustrating a main part of an example of a first terminal of the laminated terminal portion of the semiconductor module. FIG. 8C is a plan view schematically illustrating a main part of an example of a connection member welded to the first terminal of the laminated terminal portion of the semiconductor module.

The laminated terminal portion 100D according to the fourth embodiment includes the first terminal 110 having a first region 111, a pair of second regions 112, and a pair of third regions 113 as illustrated in FIGS. 8A and 8B. The first region 111 of the first terminal 110 of the laminated terminal portion 100D is disposed on a first surface 131 of an insulating sheet 130 extending in a first direction D1 and has a first width W1 in a second direction D2 perpendicular to the first direction D1 in plan view. The second regions 112 each extend from the first region 111 and have a second width W2 narrower than the first width W1 in the second direction D2 in plan view. The second regions 112 are each perpendicular to the first surface 131 of the insulating sheet 130 and each extend from the first region 111 in a third direction D3, which is away from the first surface 131. The third regions 113 are located away from the first surface 131 of the insulating sheet 130 and are electrically connected to the first region 111 and the second regions 112.

In the case of the laminated terminal portion 100D, in the third direction D3, a surface 111a (the upper surface) of the first region 111, the surface 111a facing in a direction opposite to the direction of the insulating sheet 130, is located closer to the insulating sheet 130 than surfaces 113a (the lower surfaces) of the third regions 113, the surfaces 113a facing in the direction of the insulating sheet 130. The third regions 113 of the first terminal 110 of the laminated terminal portion 100D are disposed outside the first region 111 in plan view. That is, the third regions 113 do not overlap with the first region 111 in plan view.

The first region 111 of the first terminal 110 of the laminated terminal portion 100D has a wide portion 111b having the first width W1 in the second direction D2 and a pair of narrow portions 111c, each of which extends from the wide portion 111b in the first direction D1 and has a third width W3 narrower than the first width W1 in the second direction D2. These narrow portions 111c are disposed away from each other at end portions of the wide portion 111b in the second direction D2. The second regions 112 extend from edge portions of the narrow portions 111c of the first region 111, the edge portions facing each other in the second direction D2, and the third regions 113 extend in the second direction D2 from the second regions 112 such that the third regions 113 do not overlap with the first region 111 in plan view.

The first terminal 110 of the laminated terminal portion 100D may be formed by forming a cut extending in the first direction D1 by punching or the like in an edge portion of a planar terminal member, the edge portion being located in the first direction D1, and forming other cuts that extend in the second direction D2 and that meet at the center of the above cut. Specifically, the first terminal 110 may be formed by forming a T-shaped cut in an edge portion of a planar terminal member in plan view, bending the two side portions of the T-shaped cut in the third direction D3 once, and bending tip portions of the bent side portions in the second direction D2 (such that the tip portions do not overlap with the planar terminal member in plan view).

As described above, in the case of the first terminal 110 of the laminated terminal portion 100D, the pair of narrow portions 111c extend from the wide portion 111b of the first region 111 in the first direction D1, and the pair of second regions 112 extend from edge portions of the narrow portions 111c, the edge portions facing each other in the second direction D2, in the third direction D3. In addition, each of the third regions 113 extends from a corresponding one of the second regions 112 in the second direction D2 at a location higher than the wide portion 111b and the narrow portions 111c of the first region 111 via the second regions 112 with respect to the insulating sheet 130 such that the third regions 113 do not overlap with the first region 111 in plan view.

For example, the connection member 300 such as a bus bar as illustrated in FIG. 8C is welded to the first terminal 110 of the laminated terminal portion 100D. The connection member 300 welded to the first terminal 110 of the laminated terminal portion 100D has a pair of planar penetration portions 340 (cuts) into which the pair of second regions 112 extending from the pair of narrow portions 111c of the first terminal 110 are inserted.

To weld the first terminal 110 of the laminated terminal portion 100D as illustrated in FIGS. 8A and 8B and the connection member 300 as illustrated in FIG. 8C, first, the connection member 300 is placed on the first terminal 110 such that the pair of second regions 112 are inserted into the pair of penetration portions 340 of the connection member 300. Consequently, the portion sandwiched between the pair of penetration portions 340 of the connection member 300 is inserted between the third regions 113 of the first terminal 110 and the insulating sheet 130. The portions outside the pair of penetration portions 340 of the connection member 300 are located over the narrow portions 111c of the first region 111. The second regions 112 penetrate through the upper and lower surfaces of the connection member 300 in the penetration portions 340. Next, after the connection member 300 is placed, a laser beam is emitted to the third regions 113 of the first terminal 110, and the third regions 113 and the connection member 300 thereunder are melted. When the melted portions are solidified, the third regions 113 and the connection member 300 are welded to each other at welding locations 4.

In this laser welding described above, the third regions 113 of the first terminal 110 are lifted from the first region 111 on the insulating sheet 130 to locations away from the insulating sheet 130 via the second regions 112. The connection member 300 is inserted between the lifted third regions 113 and the insulating sheet 130, and the third regions 113 and the connection member 300 are welded to each other. There is a space between the connection member 300, which is welded to the third regions 113, and the insulating sheet 130. Thus, since the heat generated in the connection member 300 by the emission of the laser beam to the third regions 113 is insulated by the space, the heat is not directly transferred to the insulating sheet 130. As a result, the insulating sheet 130 is prevented from being damaged by the heat generated by the welding. Since the insulating sheet 130 is prevented from being damaged, the material properties of the insulating sheet 130 are prevented from being changed. Thus, since deterioration in insulating performance is prevented, deterioration in dielectric strength is prevented.

In this embodiment, the connection member 300 as illustrated in FIG. 8C is welded to the first terminal 110 of the laminated terminal portion 100D. In this way, when the portion between the pair of penetration portions 340 is inserted between the third regions 113 and the insulating sheet 130, the portions outside the pair of penetration portions 340 are located over the narrow portions 111c of the first region 111. Thus, the connection member 300 is inserted easily without bumping into the insulating sheet 130.

When there is no possibility or a low possibility that the connection member 300 bumps into the insulating sheet 130 at the time of insertion of the connection member 300, this connection member 300, which is welded to the first terminal 110 of the laminated terminal portion 100D, may be formed to have a shape such that no portion is located over the narrow portions 111c of the first region 111. That is, the connection member 300 may be formed as illustrated in the above FIG. 7C or may be formed to have a certain width insertable into the gap between the pair of second regions 112.

Fifth Embodiment

Figure 9A:
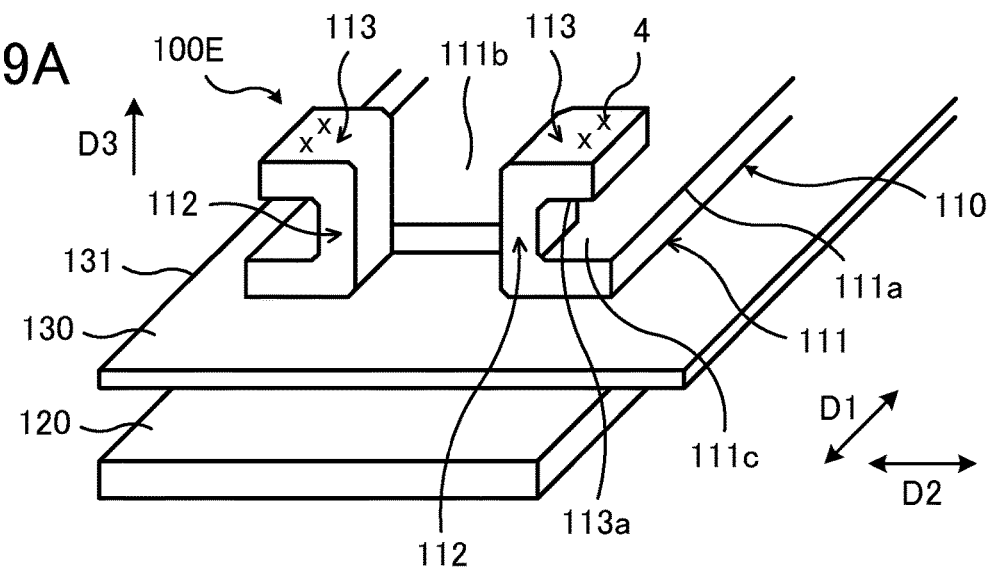
FIGS. 9A to 9C each illustrate an example of a laminated terminal portion of a semiconductor module according to a fifth embodiment.
Figure 9B:
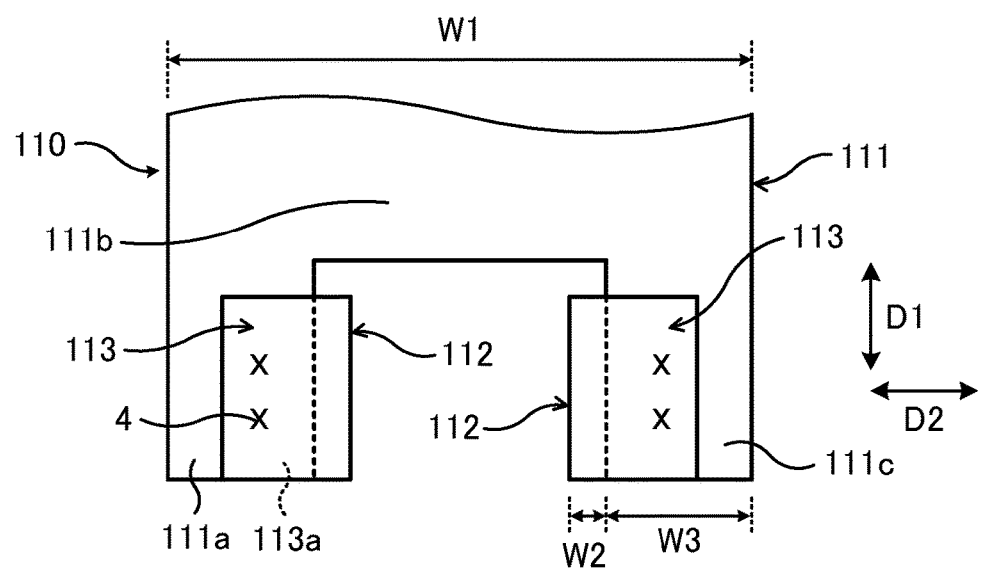
Figure 9C:
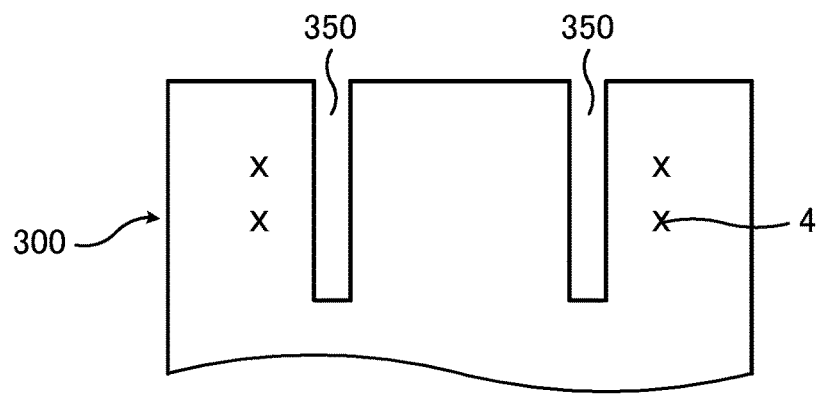

FIGS. 9A to 9C each illustrate an example of a laminated terminal portion of a semiconductor module according to a fifth embodiment. FIG. 9A is a perspective view schematically illustrating a main part of an example of the laminated terminal portion of the semiconductor module. FIG. 9B is a plan view schematically illustrating a main part of an example of a first terminal of the laminated terminal portion of the semiconductor module. FIG. 9C is a plan view schematically illustrating a main part of an example of a connection member welded to the first terminal of the laminated terminal portion of the semiconductor module.

The laminated terminal portion 100E according to the fifth embodiment includes the first terminal 110 having a first region 111, a pair of second regions 112, and a pair of third regions 113 as illustrated in FIGS. 9A and 9B. The first region 111 of the first terminal 110 of the laminated terminal portion 100E is disposed on a first surface 131 of an insulating sheet 130 extending in a first direction D1 and has a first width W1 in a second direction D2 perpendicular to the first direction D1 in plan view. The second regions 112 each extend from the first region 111 and have a second width W2 narrower than the first width W1 in the second direction D2 in plan view. The second regions 112 are each perpendicular to the first surface 131 of the insulating sheet 130 and each extend from the first region 111 in a third direction D3, which is away from the first surface 131. The third regions 113 are located away from the first surface 131 of the insulating sheet 130 and are electrically connected to the first region 111 and the second regions 112.

In the case of the laminated terminal portion 100E, in the third direction D3, a surface 111a (the upper surface) of the first region 111, the surface 111a facing in a direction opposite to the direction of the insulating sheet 130, is located closer to the insulating sheet 130 than surfaces 113a (the lower surfaces) of the third regions 113, the surfaces 113a facing in the direction of the insulating sheet 130. The third regions 113 of the first terminal 110 of the laminated terminal portion 100E are disposed to overlap with the first region 111 in plan view.

The first region 111 of the first terminal 110 of the laminated terminal portion 100E has a wide portion 111b having the first width W1 in the second direction D2 and a pair of narrow portions 111c, each of which extends from the wide portion 111b in the first direction D1 and has a third width W3 narrower than the first width W1 in the second direction D2. These narrow portions 111c are disposed away from each other at end portions of the wide portion 111b in the second direction D2. The second regions 112 extend from edge portions of the narrow portions 111c of the first region 111, the edge portions facing each other in the second direction D2, and the third regions 113 extend in the second direction D2 from the second regions 112 such that the third regions 113 overlap with the narrow portions 111c of the first region 111 in plan view.

The first terminal 110 of the laminated terminal portion 100E may be formed by forming a cut extending in the first direction D1 by punching or the like in an edge portion of a planar terminal member, the edge portion being located in the first direction D1, and forming other cuts that extend in the second direction D2 and that meet at the center of the above cut. Specifically, the first terminal 110 may be formed by forming a T-shaped cut in an edge portion of a planar terminal member in plan view, bending the two side portions of the T-shaped cut in the third direction D3 once, and bending tip portions of the bent side portions in the second direction D2 (such that the tip portions overlap with the planar terminal member in plan view).

As described above, in the case of the first terminal 110 of the laminated terminal portion 100E, the pair of narrow portions 111c extend from the wide portion 111b of the first region 111 in the first direction D1, and the pair of second regions 112 extend from the edge portions of the pair of narrow portions 111c, the edge portions facing each other in the second direction D2, in the third direction D3. In addition, each of the third regions 113 extends from a corresponding one of the second regions 112 in the second direction D2 at a location higher than the wide portion 111b and the narrow portions 111c of the first region 111 via the second regions 112 with respect to the insulating sheet 130 such that the third regions 113 overlap with the narrow portions 111c of the first region 111 in plan view.

For example, the connection member 300 such as a bus bar as illustrated in FIG. 9C is welded to the first terminal 110 of the laminated terminal portion 100E. The connection member 300 welded to the first terminal 110 of the laminated terminal portion 100E has a pair of planar penetration portions 350 (cuts) into which the pair of second regions 112 extending from the pair of narrow portions 111c of the first terminal 110 are inserted.

To weld the first terminal 110 of the laminated terminal portion 100E as illustrated in FIGS. 9A and 9B and the connection member 300 as illustrated in FIG. 9C, first, the connection member 300 is placed on the first terminal 110 such that the pair of second regions 112 are inserted into the pair of penetration portions 350 of the connection member 300. Consequently, the portions outside the pair of penetration portions 350 of the connection member 300 are inserted between the narrow portions 111c of the first region 111 and the third regions 113 of the first terminal 110. The portion between the pair of penetration portions 350 of the connection member 300 is located above the insulating sheet 130 between the narrow portions 111c of the first region 111. The second regions 112 penetrate through the upper and lower surfaces of the connection member 300 in the penetration portions 350. After the connection member 300 is placed, a laser beam is emitted to the third regions 113 of the first terminal 110, and the third regions 113 and the connection member 300 thereunder are melted. When the melted portions are solidified, the third regions 113 and the connection member 300 are welded to each other at welding locations 4.

In this laser welding described above, the third regions 113 of the first terminal 110 are lifted from the first region 111 on the insulating sheet 130 to locations away from the insulating sheet 130 via the second regions 112. The connection member 300 is inserted between the lifted third regions 113 and the narrow portions 111c of the first region 111, and the third regions 113 and the connection member 300 are welded to each other. Since the connection member 300 is located away from the insulating sheet 130 and the narrow portions 111c of the first region 111 are located under the connection member 300, the heat generated in the connection member 300 by the emission of the laser beam to the third regions 113 is not directly transferred to the insulating sheet 130. As a result, the insulating sheet 130 is prevented from being damaged by the heat generated by the welding. Since the insulating sheet 130 is prevented from being damaged, the material properties of the insulating sheet 130 are prevented from being changed. Thus, since deterioration in insulating performance is prevented, deterioration in dielectric strength is prevented.

In this embodiment, the connection member 300 as illustrated in FIG. 9C is welded to the first terminal 110 of the laminated terminal portion 100E. However, the connection member 300 may be formed without the portion between the pair of penetration portions 350.

Sixth Embodiment

Figure 10A:
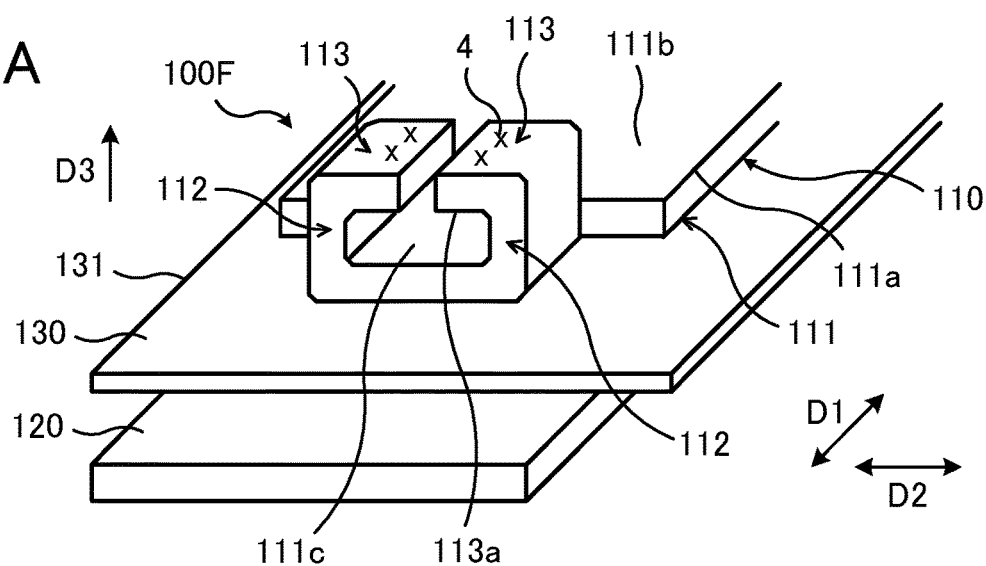
FIGS. 10A to 10C each illustrate an example of a laminated terminal portion of a semiconductor module according to a sixth embodiment.
Figure 10B:
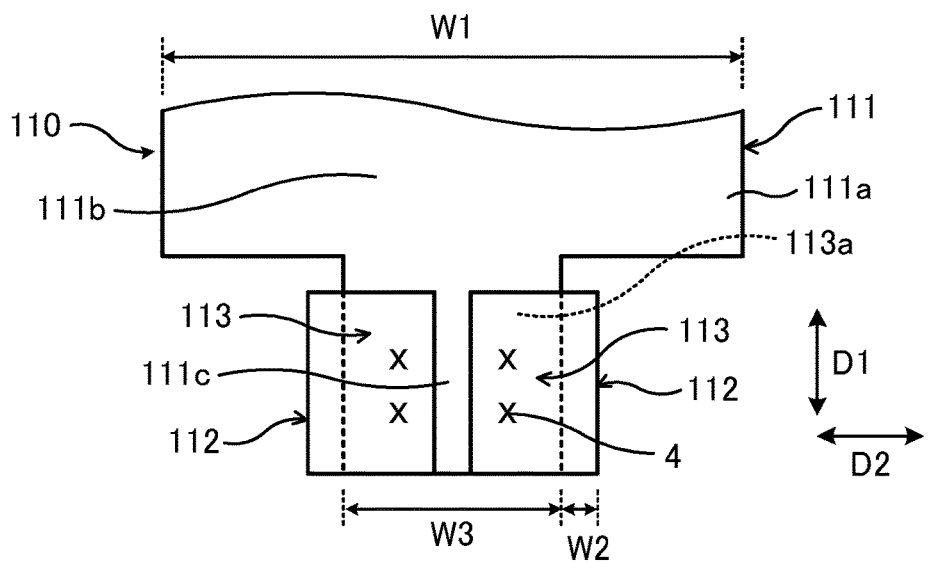
Figure 10C:
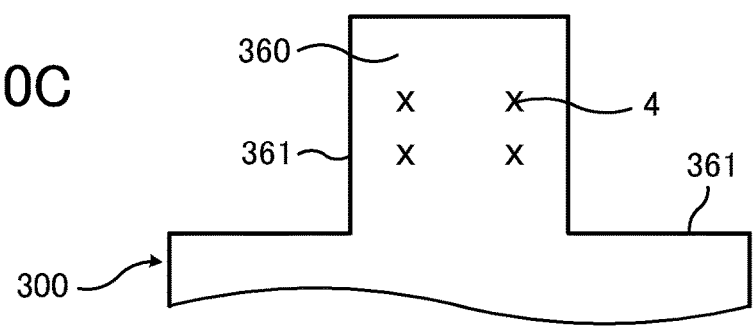

FIGS. 10A to 10C each illustrate an example of a laminated terminal portion of a semiconductor module according to a sixth embodiment. FIG. 10A is a perspective view schematically illustrating a main part of an example of the laminated terminal portion of the semiconductor module. FIG. 10B is a plan view schematically illustrating a main part of an example of a first terminal of the laminated terminal portion of the semiconductor module. FIG. 10C is a plan view schematically illustrating a main part of an example of a connection member welded to the first terminal of the laminated terminal portion of the semiconductor module.

The laminated terminal portion 100F according to the sixth embodiment includes the first terminal 110 having a first region 111, a pair of second regions 112, and a pair of third regions 113 as illustrated in FIGS. 10A and 10B. The first region 111 of the first terminal 110 of the laminated terminal portion 100F is disposed on a first surface 131 of an insulating sheet 130 extending in a first direction D1 and has a first width W1 in a second direction D2 perpendicular to the first direction D1 in plan view. The second regions 112 each extend from the first region 111 and have a second width W2 narrower than the first width W1 in the second direction D2 in plan view. The second regions 112 are each perpendicular to the first surface 131 of the insulating sheet 130 and each extend from the first region 111 in a third direction D3, which is away from the first surface 131. The third regions 113 are located away from the first surface 131 of the insulating sheet 130 and are electrically connected to the first region 111 and the second regions 112.

In the case of the laminated terminal portion 100F, in the third direction D3, a surface 111a (the upper surface) of the first region 111, the surface 111a facing in a direction opposite to the direction of the insulating sheet 130, is located closer to the insulating sheet 130 than surfaces 113a (the lower surfaces) of the third regions 113, the surfaces 113a facing in the direction of the insulating sheet 130. The third regions 113 of the first terminal 110 of the laminated terminal portion 100F are disposed to overlap with the first region 111 in plan view.

The first region 111 of the first terminal 110 of the laminated terminal portion 100F has a wide portion 111b having the first width W1 in the second direction D2 and has a narrow portion 111c that extends from the wide portion 111b in the first direction D1 and that has a third width W3 narrower than the first width W1 in the second direction D2. The second regions 112 extend from edge portions of the narrow portion 111c of the first region 111, the edge portions facing each other in the second direction D2, and the third regions 113 extend in the second direction D2 from the second regions 112 such that the third regions 113 overlap with the narrow portion 111c of the first region 111 in plan view.

The first terminal 110 of the laminated terminal portion 100F may be formed by forming a cut extending in the second direction D2 by punching or the like in each of two side portions of a planar terminal member, the two side portions being located in the second direction D2, bending the portions outside the cuts (tip portions of the planar terminal member) in the third direction D3 once, and bending tip portions of the bent portions in the second direction D2 (such that the tip portions overlap with the planar terminal member in plan view).

As described above, in the case of the first terminal 110 of the laminated terminal portion 100F, the narrow portion 111c extends from the wide portion 111b of the first region 111 in the first direction D1, and the pair of second regions 112 extend from the edge portions of the narrow portion 111c, the edge portions facing each other in the second direction D2, in the third direction D3. In addition, each of the third regions 113 extends from a corresponding one of the second regions 112 in the second direction D2 at a location higher than the wide portion 111b and the narrow portion 111c of the first region 111 via the second regions 112 with respect to the insulating sheet 130 such that the third regions 113 overlap with the narrow portion 111c of the first region 111 in plan view.

For example, the connection member 300 such as a bus bar as illustrated in FIG. 10C is welded to the first terminal 110 of the laminated terminal portion 100F. The connection member 300 welded to the first terminal 110 of the laminated terminal portion 100F has a planar penetration portion 360 inserted into the gap between the pair of second regions 112 extending from the narrow portion 111c of the first terminal 110.

To weld the first terminal 110 of the laminated terminal portion 100F as illustrated in FIGS. 10A and 10B and the connection member 300 as illustrated in FIG. 10C, first, the connection member 300 is placed on the first terminal 110 such that the penetration portion 360 of the connection member 300 is inserted into the gap between the pair of second regions 112. Consequently, the penetration portion 360 of the connection member 300 is inserted between the narrow portion 111c of the first region 111 and the third regions 113 of the first terminal 110. Cut portions 361 sandwiching the penetration portion 360 of the connection member 300 may be referred to as penetration portions where the second regions 112 penetrate the upper and lower surfaces of the connection member 300. After the connection member 300 is placed, a laser beam is emitted to the third regions 113 of the first terminal 110, and the third regions 113 and the connection member 300 thereunder are melted. When the melted portions are solidified, the third regions 113 and the connection member 300 are welded to each other at welding locations 4.

In this laser welding described above, the third regions 113 of the first terminal 110 are lifted from the first region 111 on the insulating sheet 130 to locations away from the insulating sheet 130 via the second regions 112. The connection member 300 is inserted between the lifted third regions 113 and the narrow portion 111c of the first region 111, and the third regions 113 and the connection member 300 are welded to each other. Since the connection member 300 is located away from the insulating sheet 130 and the narrow portion 111c of the first region 111 is located under the connection member 300, the heat generated in the connection member 300 by the emission of the laser beam to the third regions 113 is not directly transferred to the insulating sheet 130. As a result, the insulating sheet 130 is prevented from being damaged by the heat generated by the welding. Since the insulating sheet 130 is prevented from being damaged, the material properties of the insulating sheet 130 are prevented from being changed. Thus, since deterioration in insulating performance is prevented, deterioration in dielectric strength is prevented.

In this embodiment, the connection member 300 as illustrated in FIG. 10C is welded to the first terminal 110 of the laminated terminal portion 100F. However, the connection member 300 as illustrated in the above FIG. 8C may alternatively be used.

Seventh Embodiment

Figure 11A:
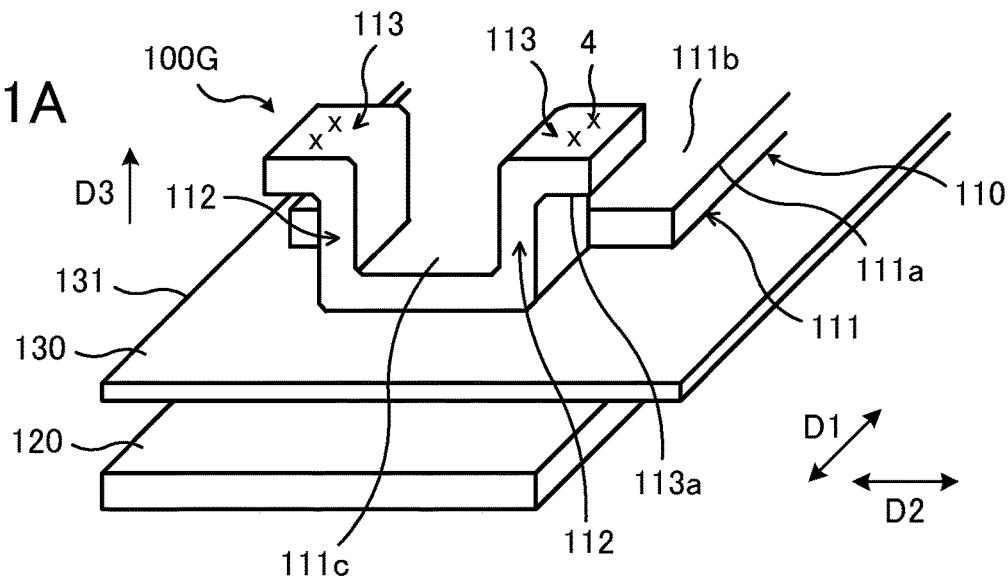
FIGS. 11A to 11C each illustrate an example of a laminated terminal portion of a semiconductor module according to a seventh embodiment.
Figure 11B:
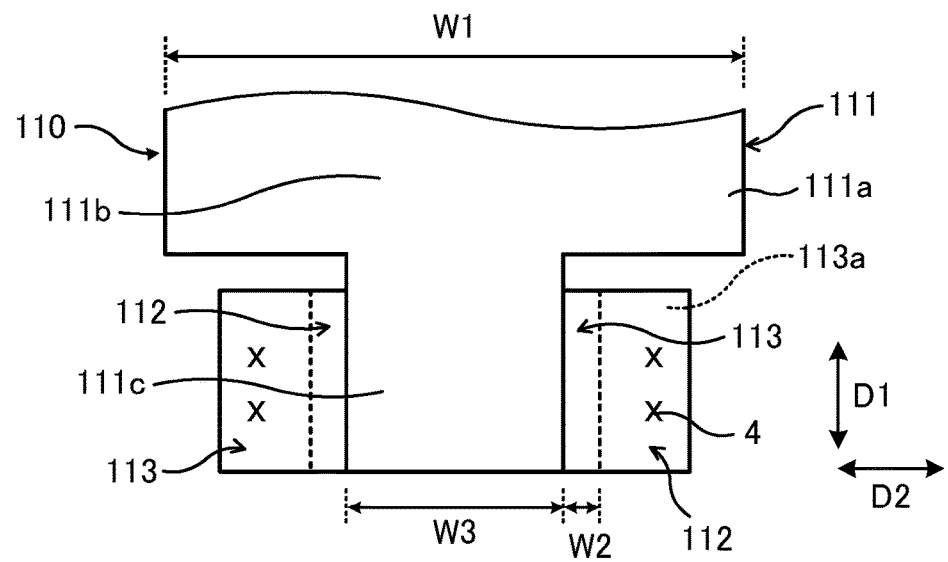
Figure 11C:
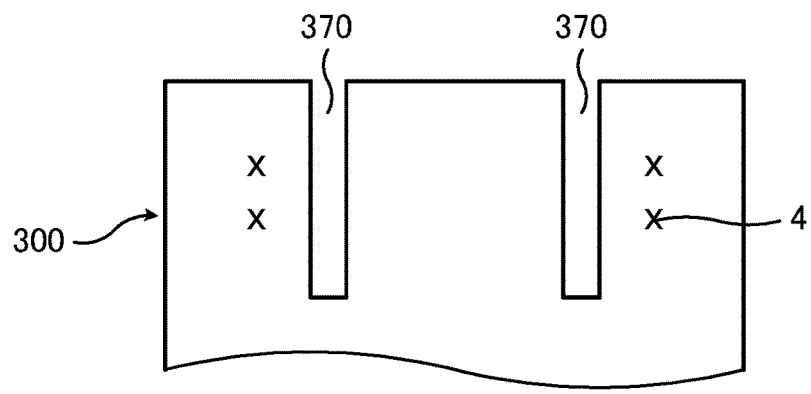

FIGS. 11A to 11C each illustrate an example of a laminated terminal portion of a semiconductor module according to a seventh embodiment. FIG. 11A is a perspective view schematically illustrating a main part of an example of the laminated terminal portion of the semiconductor module. FIG. 11B is a plan view schematically illustrating a main part of an example of a first terminal of the laminated terminal portion of the semiconductor module. FIG. 11C is a plan view schematically illustrating a main part of an example of a connection member welded to the first terminal of the laminated terminal portion of the semiconductor module.

The laminated terminal portion 100G according to the seventh embodiment includes the first terminal 110 having a first region 111, a pair of second regions 112, and a pair of third regions 113 as illustrated in FIGS. 11A and 11B. The first region 111 of the first terminal 110 of the laminated terminal portion 100G is disposed on a first surface 131 of an insulating sheet 130 extending in a first direction D1 and has a first width W1 in a second direction D2 perpendicular to the first direction D1 in plan view. The second regions 112 each extend from the first region 111 and have a second width W2 narrower than the first width W1 in the second direction D2 in plan view. The second regions 112 are each perpendicular to the first surface 131 of the insulating sheet 130 and each extend from the first region 111 in a third direction D3, which is away from the first surface 131. The third regions 113 are located away from the first surface 131 of the insulating sheet 130 and are electrically connected to the first region 111 and the second regions 112.

In the case of the laminated terminal portion 100G, in the third direction D3, a surface 111a (the upper surface) of the first region 111, the surface 111a facing in a direction opposite to the direction of the insulating sheet 130, is located closer to the insulating sheet 130 than surfaces 113a (the lower surfaces) of the third regions 113, the surfaces 113a facing in the direction of the insulating sheet 130. The third regions 113 of the first terminal 110 of the laminated terminal portion 100G are disposed outside the first region 111 in plan view. That is, the third regions 113 do not overlap with the first region 111 in plan view.

The first region 111 of the first terminal 110 of the laminated terminal portion 100G has a wide portion 111b having the first width W1 in the second direction D2 and has a narrow portion 111c that extends from the wide portion 111b in the first direction D1 and that has a third width W3 narrower than the first width W1 in the second direction D2. The second regions 112 extend from edge portions of the narrow portion 111c of the first region 111, the edge portions facing each other in the second direction D2, and the third regions 113 extend in the second direction D2 from the second regions 112 such that the third regions 113 do not overlap with the first region 111 in plan view.

The first terminal 110 of the laminated terminal portion 100G may be formed by forming a cut extending in the second direction D2 by punching or the like in each of the two side portions of a planar terminal member, the side portions being located in the second direction D2, bending the portions outside the cuts (tip portions of the planar terminal member) in the third direction D3 once, and bending tip portions of the bent portions in the second direction D2 (such that the tip portions do not overlap with the planar terminal member in plan view).

As described above, in the case of the first terminal 110 of the laminated terminal portion 100G, the narrow portion 111c extends from the wide portion 111b of the first region 111 in the first direction D1, and the pair of second regions 112 extend from the edge portions of the narrow portion 111c, the edge portions facing each other in the second direction D2, in the third direction D3. In addition, each of the third regions 113 extends from a corresponding one of the second regions 112 in the second direction D2 at a location higher than the wide portion 111b and the narrow portion 111c of the first region 111 via the second regions 112 with respect to the insulating sheet 130 such that the third regions 113 do not overlap with the first region 111 in plan view.

For example, the connection member 300 such as a bus bar as illustrated in FIG. 11C is welded to the first terminal 110 of the laminated terminal portion 100G. The connection member 300 welded to the first terminal 110 of the laminated terminal portion 100G has a pair of planar penetration portions 370 (cuts) into which the pair of second regions 112 extending from the narrow portion 111c of the first terminal 110 are inserted.

To weld the first terminal 110 of the laminated terminal portion 100G as illustrated in FIGS. 11A and 11B and the connection member 300 as illustrated in FIG. 11C, first, the connection member 300 is placed on the first terminal 110 such that the pair of second regions 112 are inserted into the pair of penetration portions 370 of the connection member 300. Consequently, the portions outside the pair of penetration portions 370 of the connection member 300 are inserted between the third regions 113 of the first terminal 110 and the insulating sheet 130. The portion between the pair of penetration portions 370 of the connection member 300 is located over the narrow portion 111c of the first region 111. The second regions 112 penetrate through the upper and lower surfaces of the connection member 300 in the penetration portions 370. After the connection member 300 is placed, a laser beam is emitted to the third regions 113 of the first terminal 110, and the third regions 113 and the connection member 300 thereunder are melted. When the melted portions are solidified, the third regions 113 and the connection member 300 are welded to each other at welding locations 4.

In this laser welding described above, the third regions 113 of the first terminal 110 are lifted from the first region 111 on the insulating sheet 130 to locations away from the insulating sheet 130 via the second regions 112. The connection member 300 is inserted between the lifted third regions 113 and the insulating sheet 130, and the third regions 113 and the connection member 300 are welded to each other. There is a space between the connection member 300 welded to the third regions 113 and the insulating sheet 130. Thus, since the heat generated in the connection member 300 by the emission of the laser beam to the third regions 113 is insulated by the space, the heat is not directly transferred to the insulating sheet 130. As a result, the insulating sheet 130 is prevented from being damaged by the heat generated by the welding. Since the insulating sheet 130 is prevented from being damaged, the material properties of the insulating sheet 130 are prevented from being changed. Thus, since deterioration in insulating performance is prevented, deterioration in dielectric strength is prevented.

In this embodiment, the connection member 300 as illustrated in FIG. 11C is welded to the first terminal 110 of the laminated terminal portion 100G. In this way, when the portions outside the pair of penetration portions 370 are inserted between the third regions 113 and the insulating sheet 130, the portion between the pair of penetration portions 370 is located over the narrow portion 111c of the first region 111. Thus, the connection member 300 is easily inserted without bumping into the insulating sheet 130.

When there is no possibility or a low possibility that the connection member 300 bumps into the insulating sheet 130 at the time of insertion of the connection member 300, this connection member 300, which is welded to the first terminal 110 of the laminated terminal portion 100G, may be formed without the portion between the pair of penetration portions 370.

Eighth Embodiment

The laminated terminal portions 100A to 100G according to the above first to seventh embodiments are examples, and various kinds of modifications may be made to the laminated terminal portions 100A to 100G. Some examples will hereinafter be described as an eighth embodiment.

FIGS. 12A, 12B, 13A, and 13B each illustrate an example of a laminated terminal portion of a semiconductor module according to an eighth embodiment. FIGS. 12A, 12B, 13A, and FIG. 13B are each a perspective view schematically illustrating a main part of an example of a laminated terminal portion of a semiconductor module.

Figure 12A:
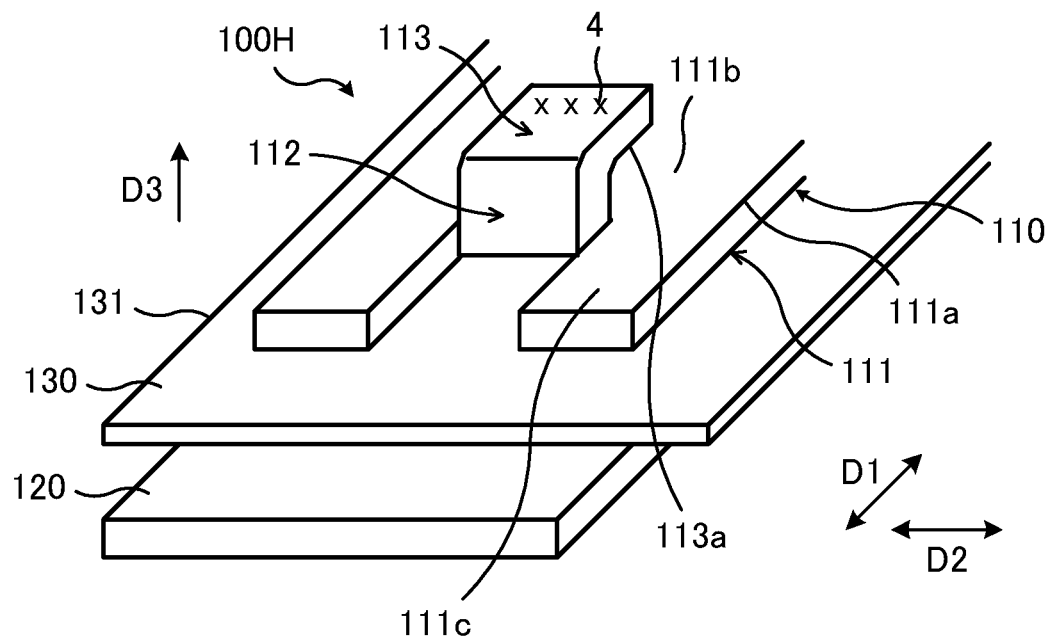
FIGS. 12A and 12B illustrate examples of a laminated terminal portion of a semiconductor module according to an eighth embodiment.

A laminated terminal portion 100H illustrated in FIG. 12A is similar to the laminated terminal portion 100A (FIGS. 4A, 4B, etc.) according to the above first embodiment. However, the laminated terminal portion 100H differs from the laminated terminal portion 100A in that the third region 113 of the first terminal 110 extends from the second region 112 in the first direction D1 such that the third region 113 overlaps with the wide portion 111b of the first region 111 in plan view.

For the laminated terminal portion 100H having such first terminal 110 as described above, the connection member 300 (FIG. 6C) according to the above second embodiment having the planar penetration portion 310 (the opening portion) through which the third region 113 and the second region 112 of the first terminal 110 penetrate is used. At the time of welding, after the connection member 300 is placed on the first terminal 110 such that the third region 113 and the second region 112 are inserted into the penetration portion 310 of the connection member 300, and the connection member 300 is slid in the first direction D1 such that the connection member 300 is inserted between the third region 113 and the first region 111. Next, a laser beam is emitted to the third region 113, and the third region 113 and the connection member 300 thereunder are welded at a welding location 4.

Since the connection member 300 is located away from the insulating sheet 130 and the wide portion 111b of the first region 111 is located under the connection member 300, the heat generated by the emission of the laser beam to the third region 113 is not directly transferred to the insulating sheet 130. In this way, the insulating sheet 130 is prevented from being damaged by the heat generated by the welding. As a result, since deterioration in insulating performance is prevented, deterioration in dielectric strength is prevented.

In the same way as this example of the relationship between the laminated terminal portion 100H and the above laminated terminal portion 100A, the third region 113 of the first terminal 110 of the laminated terminal portion 100B (FIGS. 6A and 6B) according to the above second embodiment may be formed to extend from the second region 112 in the first direction D1 such that the third region 113 does not overlap with the first region 111 in plan view. Likewise, the third region 113 of the first terminal 110 of the laminated terminal portion 100C (FIGS. 7A and 7B) according to the above third embodiment may be formed to extend from the second region 112 in the first direction D1 such that the third region 113 does not overlap with the first region 111 in plan view.

Figure 12B:
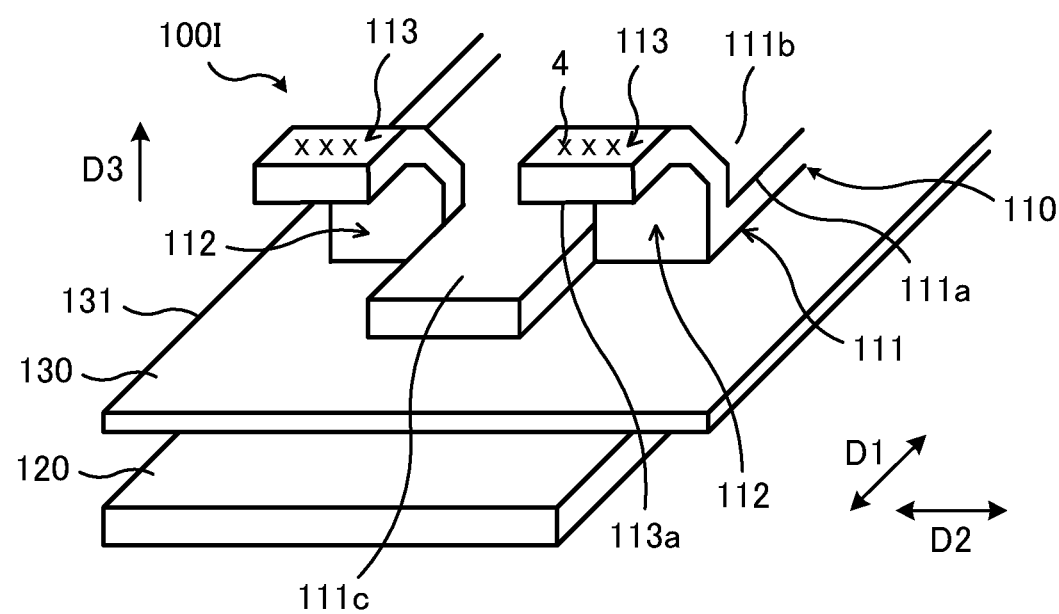

A laminated terminal portion 100I illustrated in FIG. 12B includes a pair of second regions 112 extending in a third direction D3 from two end portions of a wide portion 111b of a first terminal 110, the two end portions sandwiching a narrow portion 111c extending in a first direction D1. The laminated terminal portion 100I also includes a pair of third regions 113 extending from the pair of second regions 112 in the first direction D1 such that the third regions 113 do not overlap with a first region 111 in plan view.

In the case of the laminated terminal portion 100I, a connection member 300 is inserted between the pair of third regions 113 of the first terminal 110 and the narrow portion 111c of the first region 111. Next, a laser beam is emitted to the third regions 113, and the third regions 113 and the connection member 300 are consequently welded at welding locations 4. Since the heat generated in the connection member 300 by the emission of the laser beam is insulated by the space under the connection member 300, the heat is not directly transferred to an insulating sheet 130. In this way, the insulating sheet 130 is prevented from being damaged by the heat by the welding. As a result, since deterioration in insulating performance is prevented, deterioration in dielectric strength is prevented.

If the extension-direction tip of the narrow portion 111c of the first region 111 of the first terminal 110 of the laminated terminal portion 100I is formed to protrude more than the extension-direction tips of the third regions 113, the connection member 300 is inserted more easily between the narrow portion 111c and the third regions 113 without bumping into the insulating sheet 130.

While FIG. 12B illustrates, as an example, the laminated terminal portion 100I having the third regions 113 that do not overlap with the first region 111 in plan view, the third regions 113 may be formed to extend from the second regions 112 in the first direction D1 such that the third regions 113 overlap with the wide portion 111b of the first region 111 in plan view. In this case, a connection member 300 having a planar penetration portion (an opening portion) through which the third regions 113 and the second regions 112 of the first terminal 110 penetrate is used. Since the connection member 300 is located away from the insulating sheet 130 and the first region 111 is located under the connection member 300, the heat generated in the connection member 300 by the emission of the laser beam is not directly transferred to the insulating sheet 130.

Figure 13A:
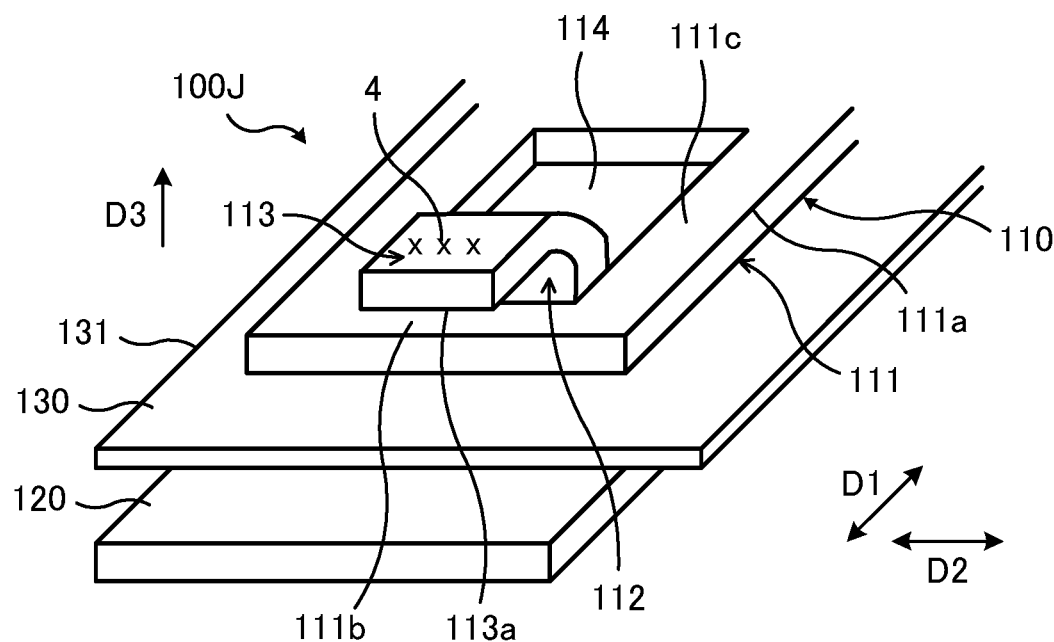
FIGS. 13A and 13B illustrate other examples of the laminated terminal portion of the semiconductor module according to the eighth embodiment.

In addition, a laminated terminal portion 100J illustrated in FIG. 13A has a first terminal 110 having an opening portion 114. The first terminal 110 has a second region 112 that extends in a third direction D3 from an inner edge portion of the opening portion 114, the edge portion being located in a first direction D1. The first terminal 110 has a third region 113 that extends from the second region 112 in the first direction D1 such that the third region 113 overlaps with a wide portion 111b of a first region 111 in plan view.

Figure 13B:
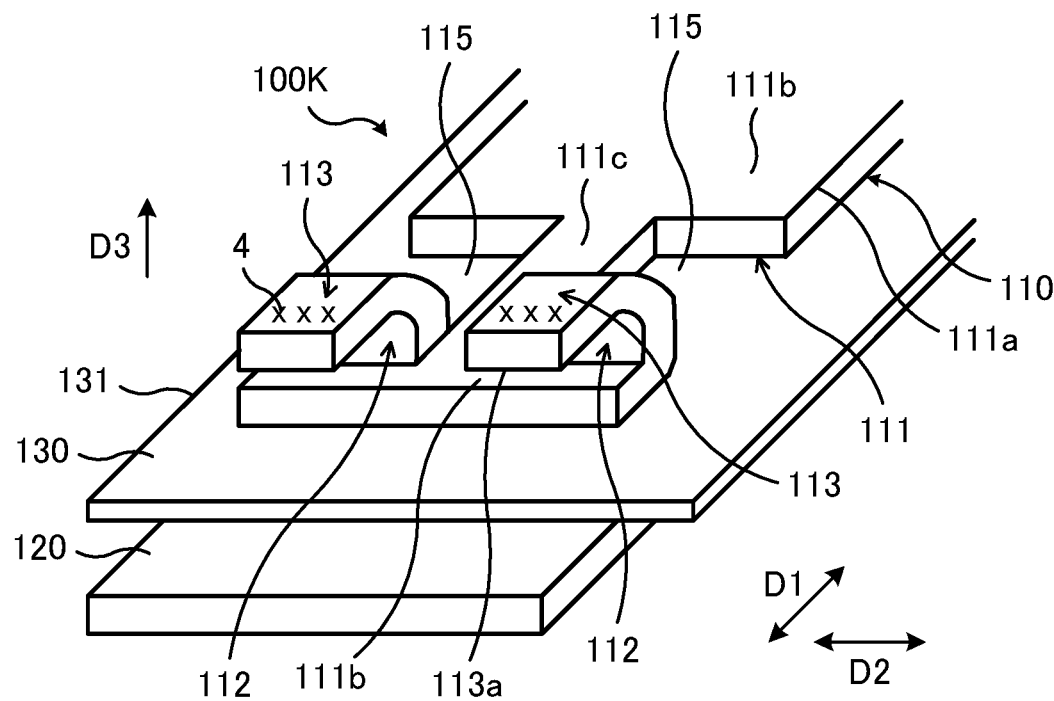

In addition, a laminated terminal portion 100K illustrated in FIG. 13B includes a pair of cut portions 115 at two end portions of a first terminal 110 in a second direction D2. The laminated terminal portion 100K includes a pair of second regions 112 that extend from edge portions of the pair of cut portions 115, the edge portions being located in a first direction D1, in a third direction D3. The laminated terminal portion 100K also includes a pair of third regions 113 that extend from the pair of second regions 112 in the first direction D1 such that the third regions 113 overlap with a wide portion 111b of a first region 111 in plan view.

In the case of the laminated terminal portions 100J and the laminated terminal portion 100K, a connection member 300 is inserted between the individual third region 113 of the first terminal 110 and the wide portion 111b of the first region 111. Next, a laser beam is emitted to the individual third region 113, and the individual third region 113 and the connection member 300 are welded at a corresponding welding location 4. Since the connection member 300 is located away from an insulating sheet 130 and the first region 111 is located under the connection member 300, the heat generated in the connection member 300 by the emission of the laser beam is not directly transferred to the insulating sheet 130. In this way, the insulating sheet 130 is prevented from being damaged by the heat by the welding. As a result, since deterioration in insulating performance is prevented, deterioration in dielectric strength is prevented.

In the case of the laminated terminal portion 100J and the laminated terminal portion 100K, if the extension-direction tip of the wide portion 111b of the first region 111 of the first terminal 110 is formed to protrude more than the extension-direction tip of the individual third region 113, the connection member 300 is inserted more easily between the wide portion 111b and the individual third region 113 without bumping into the insulating sheet 130.

In the case of the laminated terminal portion 100J and the laminated terminal portion 100K, as an example, the individual third region 113 is disposed to overlap with the wide portion 111b of the first region 111 in plan view. However, alternatively, the individual third region 113 may be formed to extend in the first direction D1 from the corresponding second region 112 such that the individual third region 113 does not overlap with the first region 111 in plan view. In this case, a connection member 300 having a planar penetration portion (an opening portion) through which the individual third region 113 and the individual second regions 112 of the first terminal 110 penetrate is used. There is a space under the connection member 300 at the time of welding. Thus, since the heat generated in the connection member 300 by the emission of the laser beam is insulated by the space, the heat is not directly transferred to the insulating sheet 130.

Ninth Embodiment

Hereinafter, a manufacturing method of a semiconductor device including a semiconductor module having any one of the laminated terminal portions as described in the above first to eighth embodiments, a connection member, and a capacitor will be described as a ninth embodiment.

Figure 14:
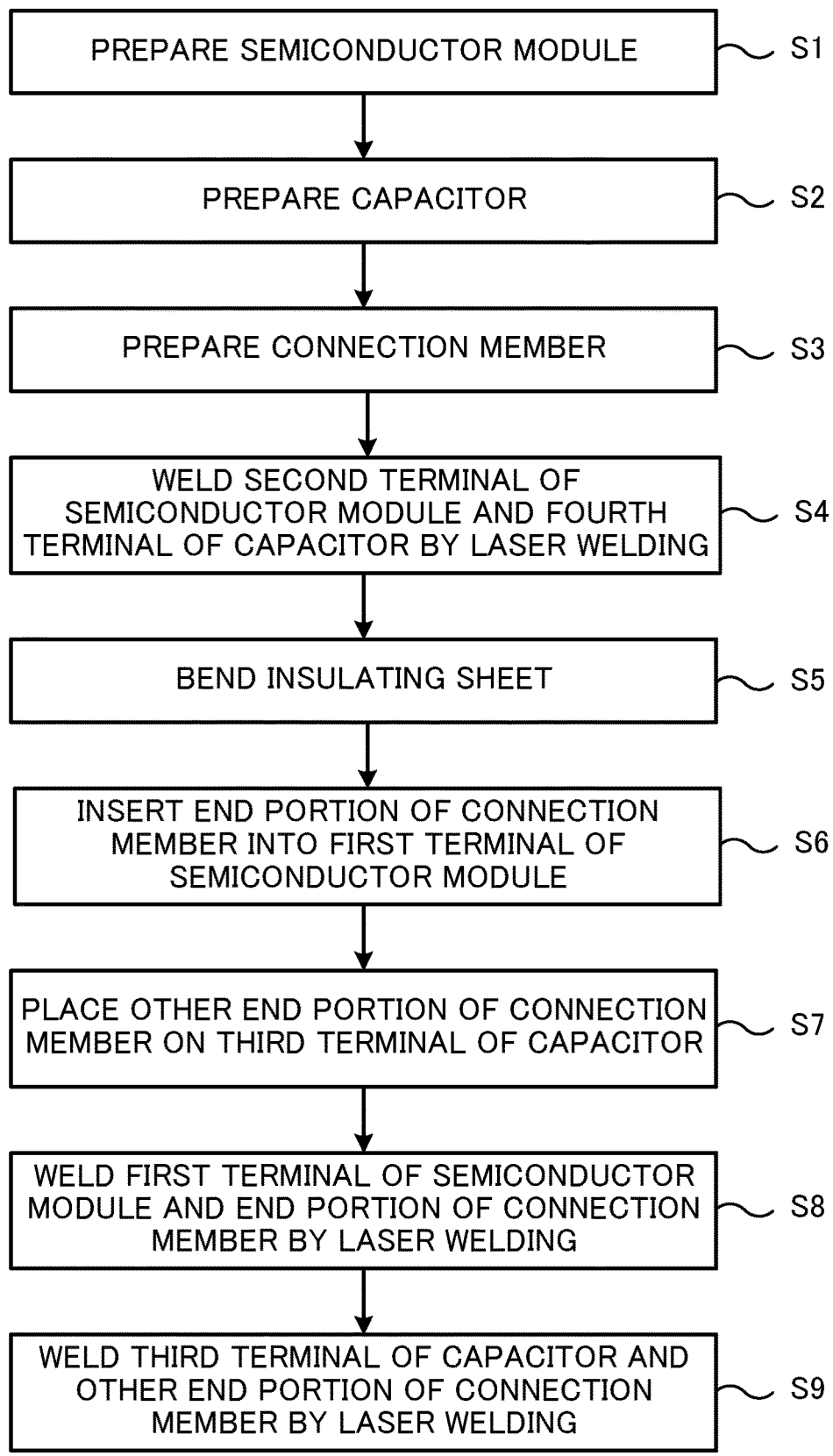
FIG. 14 illustrates a semiconductor device manufacturing method according to a ninth embodiment.

FIG. 14 is a flowchart illustrating a semiconductor device manufacturing method according to a ninth embodiment.

To manufacture a semiconductor device (for example, the above semiconductor device 5 as illustrated in FIG. 5A), the semiconductor module 1 or the like having any one of the above laminated terminal portions 100A to 100K, etc. as described in the first to eighth embodiments is prepared (step S1). Next, a capacitor 200 as described above, which is connected to the semiconductor module 1 or the like prepared in step S1, is prepared (step S2). In addition, a connection member 300 as described above, which is connected to the semiconductor module 1 or the like prepared in step S1 and the capacitor 200 prepared in step S2, is prepared. That is, a connection member 300 shaped based on, for example, the structure of the prepared one of the laminated terminal portions 100A to 100K, etc. is prepared (step S3). Steps S1 to S3 may be performed in any order.

After the semiconductor module 1 or the like, the capacitor 200, and the connection member 300 are prepared, first, the second terminal 120 of the semiconductor module 1 or the like and the fourth terminal 240 of the capacitor 200 are welded to each other at a welding location 2 by laser welding (step S4). In this step, the fourth terminal 240 of the capacitor 200 is placed on the second terminal 120 of the semiconductor module 1 or the like, and a laser beam is emitted to the fourth terminal 240 at the welding location 2. As a result, the second terminal 120 of the semiconductor module 1 or the like and the fourth terminal 240 of the capacitor 200 are welded to each other by laser welding.

After the fourth terminal 240 of the capacitor 200 and the second terminal 120 of the semiconductor module 1 or the like are welded to each other by laser welding, the insulating sheet 250 of the capacitor 200 is bent to cover the fourth terminal 240, part of the second terminal 120, and the welding location 2 (step S5).

Next, an end portion of the connection member 300 is inserted under the third region 113 of the first terminal 110 of the prepared one of the laminated terminal portions 100A to 100K, etc. of the semiconductor module 1 or the like (step S6). The third region 113 is lifted to a location above the insulating sheet 130. In addition, the other end portion of the connection member 300 is placed on the third terminal 230 of the capacitor 200 (step S7). Steps S6 and S7 may be performed in any order.

Next, a laser beam is emitted to the third region 113 of the first terminal 110 of the prepared one of the laminated terminal portions 100A to 100K, etc. of the semiconductor module 1 or the like, the third region 113 being located on the one end portion of the connection member 300. As a result, the third region 113 of the first terminal 110 and the one end portion of the connection member 300 are welded to each other at a welding location 4 (step S8). In addition, a laser beam is emitted to the other end of the connection member 300 placed on the third terminal 230 of the capacitor 200. As a result, the third terminal 230 and the other end portion of the connection member 300 are welded at a welding location 3 (step S9). Steps S8 and S9 may be performed in any order.

For example, the method based on the above steps S1 to S9 is used to manufacture a semiconductor device.

In the above semiconductor device manufacturing method, as described above, one end portion of the connection member 300 is inserted under the third region 113 of the first terminal 110 of the prepared one of the laminated terminal portions 100A to 100K, etc. of the semiconductor module 1 or the like, the third region 113 being lifted above the insulating sheet 130. There is a space or part of the first region 111 between the inserted one end portion of the connection member 300 and the insulating sheet 130. Thus, the heat generated in the connection member 300 by the emission of the laser beam to the third region 113 is not directly transferred to the insulating sheet 130. In this way, the insulating sheet 130 is prevented from being damaged by the heat generated by the welding. Since the insulating sheet 130 is prevented from being damaged, the material properties of the insulating sheet 130 are prevented from being changed. Thus, since deterioration in insulating performance is prevented, deterioration in dielectric strength is prevented. A high-quality and high-performance semiconductor device in which the high-quality and high-performance semiconductor module 1 or the like and the capacitor 200 are connected to each other by using the connection member 300 is obtained.

The first to ninth embodiments have thus been described. In the case of the laminated terminal portions 100A to 100K, etc. described in the above first to eighth embodiments, the surface of each of the first terminal 110 and the connection member 300 welded to each other may be plated with nickel, so as to reduce reflection of the laser beam and absorb the laser beam. Alternatively, a process for roughening the above surfaces may be performed. This process may be performed selectively on the laser beam emission area of the first terminal 110 and the connection member 300 welded to each other. Alternatively, the process may be performed selectively on the third region 113 of the first terminal 110 to which the laser beam is directly emitted.

In addition, the above description has been made based on an example in which the connection member 300 is welded to the surface 113*a* (lower surface) of the third region 113 of the first terminal 110 of the prepared one of the laminated terminal portions 100A to 100K, etc., the surface 113*a* facing in the direction of the insulating sheet 130. However, alternatively, the connection member 300 may be welded to the upper surface of the third region 113, the upper surface facing in a direction opposite to the direction of the insulating sheet 130. However, in this case, compared with the case in which the connection member 300 is welded to the surface 113*a* of the third region 113, the connection member 300 is located farther away from the second terminal 120 and the fourth terminal 240, which are opposite in polarity to the connection member 300. Thus, the inductance reduction effect could be reduced.

In addition, the number of second regions 112 and the number of third regions 113 that extend from the wide portions 111*b* or narrow portions 111*c* of the first region 111 of the first terminal 110 of the prepared one of the laminated terminal portions 100A to 100K, etc. are not limited to the above examples. In addition, the number of narrow portions 111*c* that extend from the wide portion 111*b* of the first region 111 is not limited to the above examples. More second regions 112, third regions 113, or narrow portions 111*c* may be formed. Alternatively, less second regions 112, third regions 113, or narrow portions 111*c* may be formed.

In one aspect, it is possible to prevent damage to an insulating sheet when a connection member is welded to a terminal of a semiconductor module.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor module, comprising:
an insulating sheet that has a first surface and extends in a first direction in a plan view of the semiconductor module; and
a first terminal that has
a first region disposed on the first surface of the insulating sheet and having a first width in a second direction perpendicular to the first direction in the plan view,
a second region extending from the first region and having a second width in the second direction narrower than the first width in the plan view, and
a third region located away from the first surface and being electrically connected to both the first region and the second region, wherein:
the insulating sheet is a planar sheet and has a first surface side where the first surface is provided; and
the first region, the second region and the third region are arranged at the first surface side of the insulating sheet, and are arranged within the first surface in the plan view.

2. The semiconductor module according to claim 1, wherein, in a third direction that is perpendicular to the first surface, an upper surface of the first region opposite to a rear surface of the first region that faces the first surface of the insulating sheet is located closer to the insulating sheet than is a rear surface of the third region facing the first surface of the insulating sheet.

3. The semiconductor module according to claim 1, wherein the third region overlaps the first region in the plan view.

4. The semiconductor module according to claim 1, wherein the third region is located outside the first region in the plan view.

5. The semiconductor module according to claim 1,
wherein the first region has a wide portion having the first width in the second direction and a narrow portion extending from the wide portion in the first direction and having a third width in the second direction narrower than the first width in the plan view,
wherein the second region extends from one side of the wide portion that extends in the second direction, and
wherein the third region extends from the second region in the first direction.

6. The semiconductor module according to claim 5, wherein the narrow portion extends in the first direction from a portion of the one side that includes one of opposite ends of the one side in the plan view.

7. The semiconductor module according to claim 5, wherein the narrow portion extends in the first direction from a portion of the one side that is disposed away from one of opposite ends of the one side in the plan view.

8. The semiconductor module according to claim 1,
wherein the first region has a wide portion having the first width in the second direction and a narrow portion extending from the wide portion in the first direction and having a third width in the second direction narrower than the first width in the plan view,
wherein the second region extends from one side of the narrow portion that extends in the first direction, and
wherein the third region extends from the second region in the second direction.

9. The semiconductor module according to claim 8, wherein the narrow portion extends in the first direction from a portion of one side of the wide portion that extends in the second direction and that includes one of opposite ends of the one side of the wide portion in the plan view.

10. The semiconductor module according to claim 8, wherein the narrow portion extends in the first direction from a portion of one side of the wide portion that extends in the second direction and that is disposed away from one of opposite ends of the one side of the wide portion in the plan view.

11. The semiconductor module according to claim 1, further comprising a second terminal disposed on a second surface of the insulating sheet, the second surface being opposite to the first surface.

12. A semiconductor device, comprising:
the semiconductor module according to claim 1; and
a connection member welded to the third region.

13. The semiconductor device according to claim 12, wherein the connection member is welded to a rear surface of the third region that faces the first surface of the insulating sheet.

14. The semiconductor device according to claim 13, wherein the connection member has a welding area that is welded to the rear surface of the third region and an opening through which the second region penetrates the connection member.

15. The semiconductor device according to claim 12, further comprising a capacitor including a third terminal connected to the connection member.

* * * * *